(12) United States Patent
Tokito

(10) Patent No.: US 11,987,184 B2
(45) Date of Patent: May 21, 2024

(54) VEHICLE-MOUNTED CAMERA

(71) Applicant: Sony Semiconductor Solutions Corporation, Kanagawa (JP)

(72) Inventor: Toshihiro Tokito, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 461 days.

(21) Appl. No.: 17/289,189

(22) PCT Filed: Nov. 8, 2019

(86) PCT No.: PCT/JP2019/043876
§ 371 (c)(1),
(2) Date: Apr. 27, 2021

(87) PCT Pub. No.: WO2020/100740
PCT Pub. Date: May 22, 2020

(65) Prior Publication Data
US 2022/0009425 A1 Jan. 13, 2022

(30) Foreign Application Priority Data
Nov. 15, 2018 (JP) .................. 2018-214503

(51) Int. Cl.
*B60R 11/04* (2006.01)
*H04N 23/57* (2023.01)
*H05K 1/11* (2006.01)

(52) U.S. Cl.
CPC ............. *B60R 11/04* (2013.01); *H04N 23/57* (2023.01); *H05K 1/118* (2013.01);
(Continued)

(58) Field of Classification Search
CPC . B60R 11/04; B60R 2300/10; B60R 2300/30; H04N 23/57; H05K 1/118; H05K 2201/10151
(Continued)

(56) References Cited

U.S. PATENT DOCUMENTS 10,660,204 B2 * 5/2020 Kim .................... H05K 1/144
2011/0205378 A1 8/2011 Kobayashi
(Continued)

FOREIGN PATENT DOCUMENTS

CN 102169274 A 8/2011
CN 202 587 160 U 12/2012
(Continued)

OTHER PUBLICATIONS

International Written Opinion and English translation thereof dated Jan. 21, 2020 in connection with International Application No. PCT/JP2019/043876.
(Continued)

*Primary Examiner* — Frantz B Jean
(74) *Attorney, Agent, or Firm* — Wolf, Greenfield & Sacks, P.C.

(57) ABSTRACT

[Object] To provide a vehicle-mounted camera capable of successfully absorbing stress applied to a flexible board that connects a main board and an imaging device board to each other.
[Solving Means] The vehicle-mounted camera includes an imaging device board, a main board, and a flexible board. The imaging device board includes a first terminal. The main board includes a second terminal. The flexible board includes a first connection portion to be connected to the first terminal, a second connection portion to be connected to the second terminal, and a first bending portion and a second bending portion that are located between the first connection
(Continued)

portion and the second connection portion and are bent along a first bending axis and a second bending axis intersecting with each other in a developed state of the flexible board. The vehicle-mounted camera is capable of absorbing stress in any direction applied to the flexible board.

5 Claims, 23 Drawing Sheets

(52) U.S. Cl.
CPC ....... *B60R 2300/10* (2013.01); *B60R 2300/30* (2013.01); *H05K 2201/10151* (2013.01)

(58) Field of Classification Search
USPC .......................................................... 348/148
See application file for complete search history.

(56) References Cited

U.S. PATENT DOCUMENTS

| | | | |
|---|---|---|---|
| 2013/0242099 A1* | 9/2013 | Sauer | B60R 1/00 348/148 |
| 2017/0187931 A1 | 6/2017 | Onishi et al. | |
| 2017/0315645 A1 | 11/2017 | Park | |
| 2017/0331058 A1 | 11/2017 | Seo | |
| 2018/0077323 A1* | 3/2018 | Sakamoto | H04N 23/51 |
| 2019/0058835 A1 | 2/2019 | Ichikawa et al. | |
| 2020/0162648 A1* | 5/2020 | Wang | B29D 11/0048 |
| 2020/0374438 A1* | 11/2020 | Park | H05K 9/0007 |

FOREIGN PATENT DOCUMENTS

| | | | | |
|---|---|---|---|---|
| CN | 105493169 A | | 4/2016 | |
| CN | 107031524 A | | 8/2017 | |
| JP | 2008-187699 A | | 8/2008 | |
| JP | 2008242446 A | | 10/2008 | |
| JP | 2015075642 A | | 4/2015 | |
| JP | 2017-118445 A | | 6/2017 | |
| JP | 2017-159694 A | | 9/2017 | |
| JP | 2017159694 A | * | 9/2017 | ............... B60R 1/00 |
| JP | 2018-045482 A | | 3/2018 | |
| WO | WO 2017/125971 A1 | | 7/2017 | |
| WO | WO-2017154745 A1 | | 9/2017 | |

OTHER PUBLICATIONS

International Preliminary Report on Patentability and English translation thereof dated May 27, 2021 in connection with International Application No. PCT/JP2019/043876.
Extended European Search Report dated Nov. 10, 2021 in connection with European Application No. 19884648.7.
International Search Report and English translation thereof dated Jan. 21, 2020 in connection with International Application No. PCT/JP2019/043876.

* cited by examiner

VEHICLE-MOUNTED CAMERA

CROSS-REFERENCE TO RELATED APPLICATIONS

This application claims the benefit under 35 U.S.C. § 371 as a U.S. National Stage Entry of International Application No. PCT/JP2019/043876, filed in the Japanese Patent Office as a Receiving Office on Nov. 8, 2019, which claims priority to Japanese Patent Application Number JP 2018-214503, filed in the Japanese Patent Office on Nov. 15, 2018, each of which is hereby incorporated by reference in its entirety.

TECHNICAL FIELD

The present technology relates to a vehicle-mounted camera capable of capturing an image of an external environment of a movable body.

BACKGROUND ART

A technique of using a front camera for drive control of an automobile is known (see, for example, Patent Literature 1). In the front camera described in Patent Literature 1, an imaging device board is disposed behind a lens with an imaging device facing forward. Thus, in this front camera, light incident on the lens from the front external environment can be made incident on the imaging device.

The front camera includes a main board for integrally controlling the drive control. The main board extends in the horizontal direction below the lens and the imaging device board. The imaging device board is connected to the main board by a flexible board extending in the vertical direction. Thus, in this front camera, signals can be transmitted and received between the imaging device board and the main board.

CITATION LIST

Patent Literature

Patent Literature 1: Japanese Patent Application Laid-open No. 2018-45482

DISCLOSURE OF INVENTION

Technical Problem

The flexible board generally has flexibility in the thickness direction, but does not have flexibility in the in-plane direction orthogonal to the thickness direction. Thus, the flexible board of the front camera as described above absorbs the stress applied in the front-rear direction but cannot absorb the load stress applied in the left-right direction, and the load is applied to the connection portions for the imaging device board and the main board.

In view of the circumstances as described above, it is an object of the present technology to provide a vehicle-mounted camera capable of successfully absorbing stress applied to a flexible board that connects a main board and an imaging device board to each other.

Solution to Problem

In order to achieve the above object, a vehicle-mounted camera according to an embodiment of the present technology includes an imaging device board, a main board, and a flexible board.

The imaging device board includes a first terminal.

The main board includes a second terminal.

The flexible board includes a first connection portion to be connected to the first terminal, a second connection portion to be connected to the second terminal, and a first bending portion and a second bending portion that are located between the first connection portion and the second connection portion and are bent along a first bending axis and a second bending axis intersecting with each other in a developed state of the flexible board.

In this configuration, the stress applied to the flexible board can be absorbed by the first and second bending portions. In particular, the first and second bending portions are configured to be bent along the first and second bending axes intersecting with each other, and thus capable of absorbing stress in any direction applied to the flexible board. In the vehicle-mounted camera including such a flexible board, high reliability can be obtained.

The flexible board may further include a first extension portion including the first bending portion, and a second extension portion including the second bending portion. In the developed state of the flexible board, the first extension portion may extend in a direction orthogonal to the first bending axis, and the second extension portion may extend in a direction orthogonal to the second bending axis.

The first bending axis and the second bending axis may be orthogonal to each other in the developed state of the flexible board.

The vehicle-mounted camera may further include an optical unit having an optical axis extending in a thickness direction of the imaging device board.

The imaging device board may further include a crystal oscillator. The flexible board may not pass above the crystal oscillator.

MODE(S) FOR CARRYING OUT THE INVENTION

An embodiment of the present technology will now be described below with reference to the drawings. Each of the drawings shows the X-axis, the Y-axis, and the Z-axis, which are appropriately orthogonal to each other.

[Overall Configuration of Vehicle-Mounted Camera 1]

Figure 1:
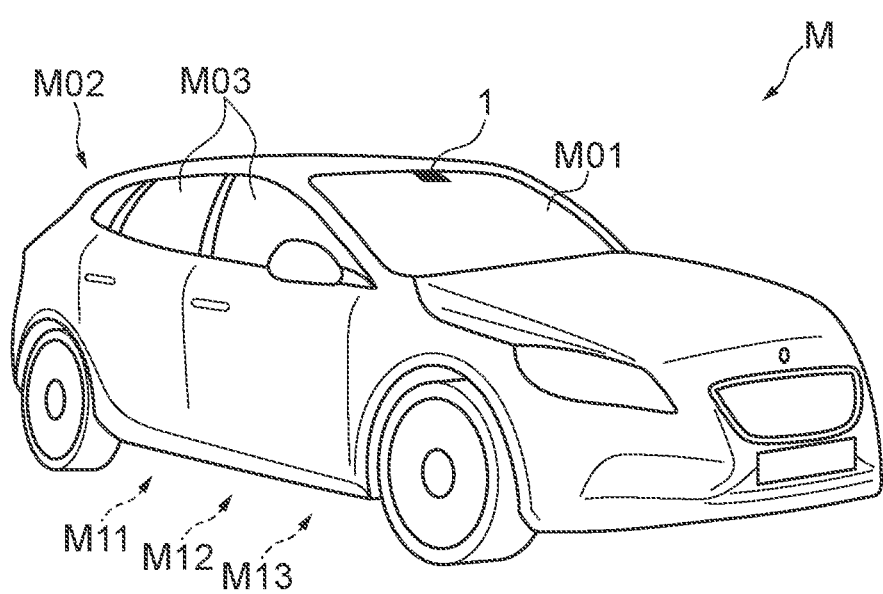
FIG. 1 is a perspective view of an automobile that includes a vehicle-mounted camera according to an embodiment of the present technology.

FIG. 1 is a perspective view of an automobile M that includes a vehicle-mounted camera 1 according to an embodiment of the present technology. The automobile M includes, as transparent glass windows, a windshield (front window) M01 disposed in front, a rear window M02 disposed in the rear, and side windows M03 disposed on the opposite lateral sides.

The vehicle-mounted camera 1 is a front sensing camera attached to an inner surface of the windshield M01. The vehicle-mounted camera 1 is disposed in an upper portion of a central region in a width direction of the windshield M01. This enables the vehicle-mounted camera 1 to successfully capture an image of the scenery ahead of the automobile M without obstructing the view of a driver.

The automobile M including the vehicle-mounted camera 1 includes therein a driving force generating mechanism M11 including, for example, an engine and a motor, a braking mechanism M12, a steering mechanism M13, and the like, in order to implement a traveling function. Further, the automobile M may include, for example, a surrounding information detector used to detect surrounding information, and a positioning section used to generate position information.

Figure 2:
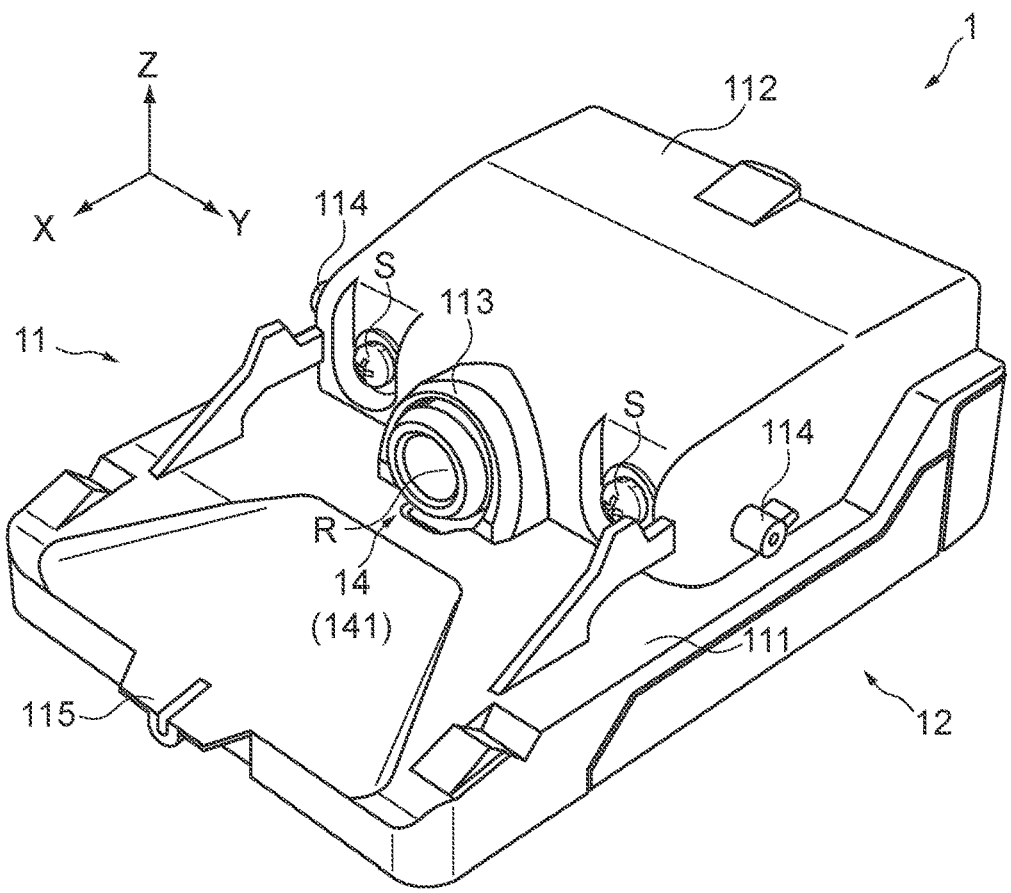
FIG. 2 is a perspective view of the vehicle-mounted camera.

FIG. 2 is a perspective view of the vehicle-mounted camera 1 before being attached to the windshield M01. The vehicle-mounted camera 1 includes a front case 11 and a bottom case 12. The front case 11 is configured as a cover member that covers the upper side of the bottom case 12 in the Z-axis direction. Additionally, the vehicle-mounted camera 1 includes an imaging unit 14 including an optical unit 141 that holds a lens R.

The front case 11 includes a flat portion 111 extending along the X-Y plane, and a box-shaped housing portion 112 disposed rearward in the X-axis direction and protruding upward in the Z-axis direction from the flat portion 111. The housing portion 112 mainly houses each structural element of the vehicle-mounted camera 1 such as the imaging unit 14 in a space formed therein.

In the housing portion 112, a lens hole 113 penetrating in the X-axis direction is formed in the central portion in the Y-axis direction of the front facing forward in the X-axis direction. The optical unit 141 of the imaging unit 14 is inserted into the lens hole 113 from the inside of the housing portion 112. As a result, in the vehicle-mounted camera 1, the lens R of the optical unit 141 is exposed to the external space toward the front in the X-axis direction.

Additionally, the housing portion 112 includes protrusions 114 protruding outward in the Y-axis direction on both side surfaces facing in the Y-axis direction. Additionally, the housing portion 112 includes an extension piece 115 extending forward in the X-axis direction in the central portion in the Y-axis direction of a front edge portion of the flat portion 111 in the X-axis direction. The protrusions 114 and the extension piece 115 are used for installation of the vehicle-mounted camera 1.

Figure 3:
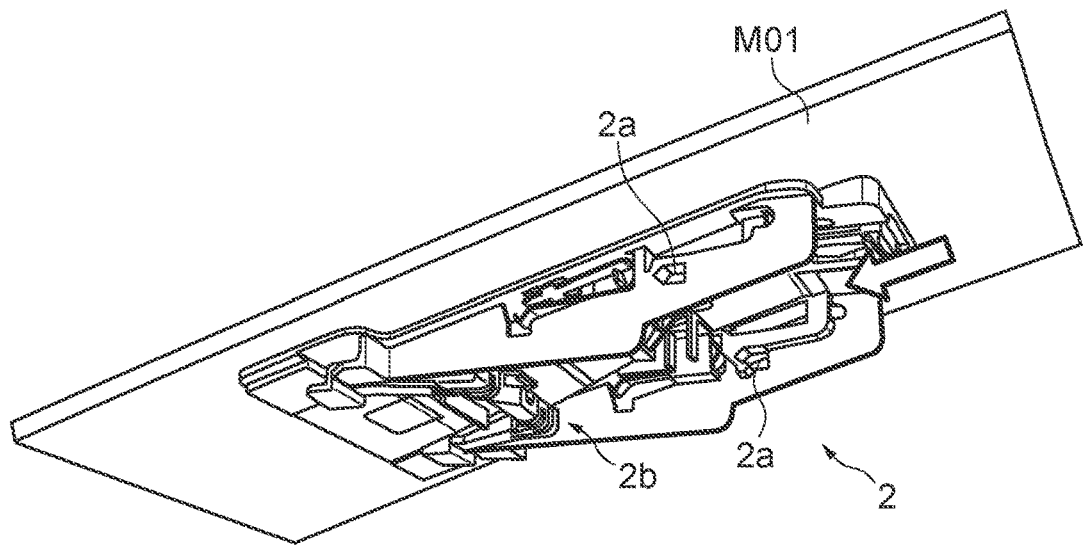
FIG. 3 is a perspective view of a bracket capable of mounting the vehicle-mounted camera.

FIG. 3 is a perspective view of a bracket 2 for installing the vehicle-mounted camera 1 on the inner surface of the windshield M01 of the automobile M. The bracket 2 is fixed to the inner surface of the windshield M01. The bracket 2 includes engagement holes 2a engageable with the protrusions 114 and a V-shaped engagement hole 2b engageable with the extension piece 115.

The vehicle-mounted camera 1 is inserted into the bracket 2 in the direction indicated by the block arrow in FIG. 3, with the front case 11 facing the windshield M01 side. The vehicle-mounted camera 1 is then fixed to the bracket 2 when the extension piece 115 is inserted into the engagement hole 2b and the protrusions 114 are fitted into the engagement holes 2a from the inside.

In such a manner, the vehicle-mounted camera 1 is installed so as to be inclined downward in the vertical direction and forward in the horizontal direction along the inner surface of the windshield M01. This allows the amount of protrusion of the vehicle-mounted camera 1 from the windshield M01 to be suppressed to be small, and thus it is advantageous from the viewpoint of ensuing a wider field of view of the driver and effectively using the space in the vehicle.

[Configuration of Each Portion of Vehicle-Mounted Camera 1]

Figure 4:
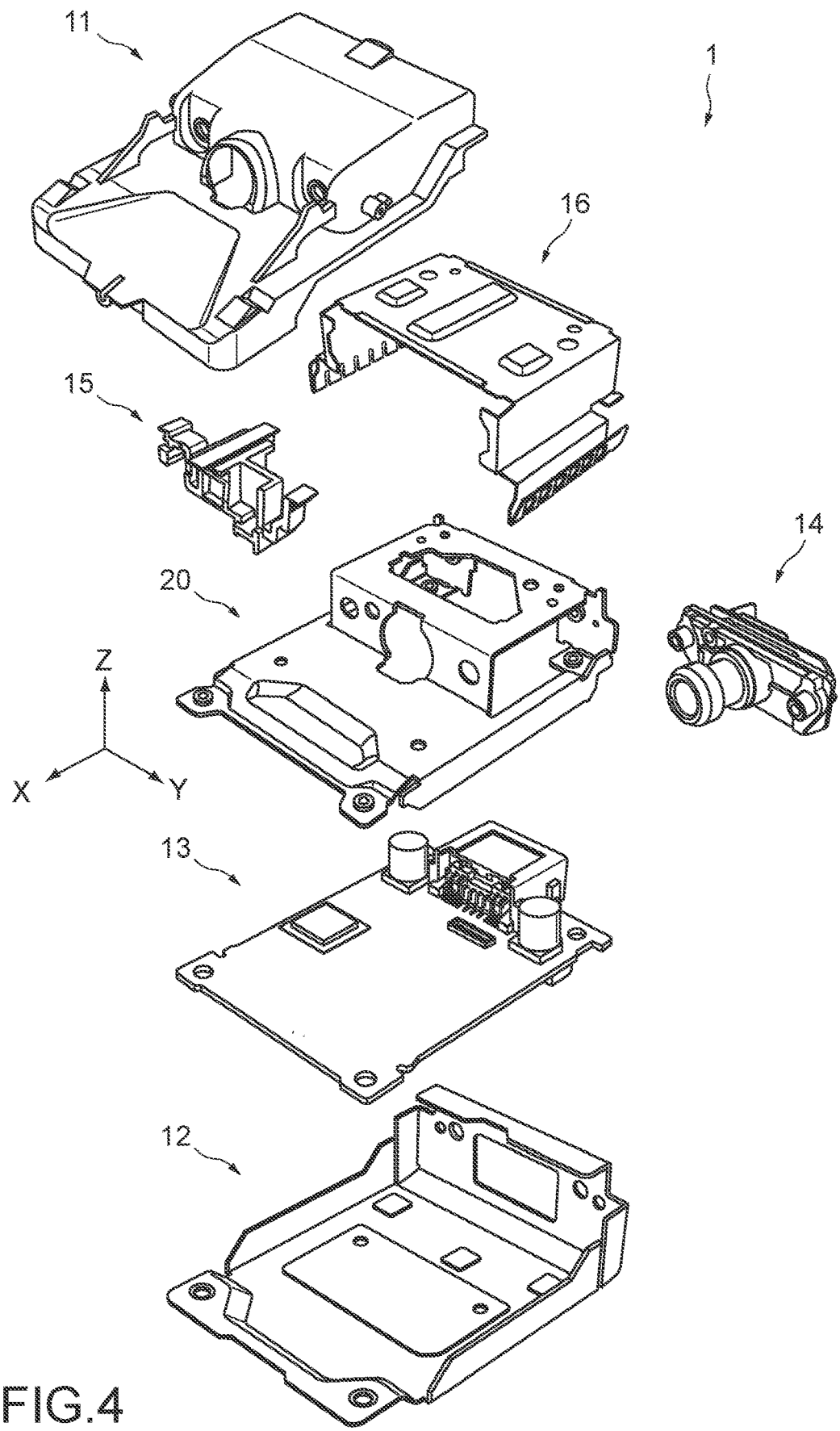
FIG. 4 is an exploded perspective view of the vehicle-mounted camera.

FIG. 4 is an exploded perspective view of the vehicle-mounted camera 1. The vehicle-mounted camera 1 further includes a frame 20, a main board 13, a pressing member 15, and a shield plate 16. The frame 20 forms a skeleton of the vehicle-mounted camera 1 and holds the front case 11, the bottom case 12, the main board 13, the imaging unit 14, the pressing member 15, and the shield plate 16.

Figure 5:
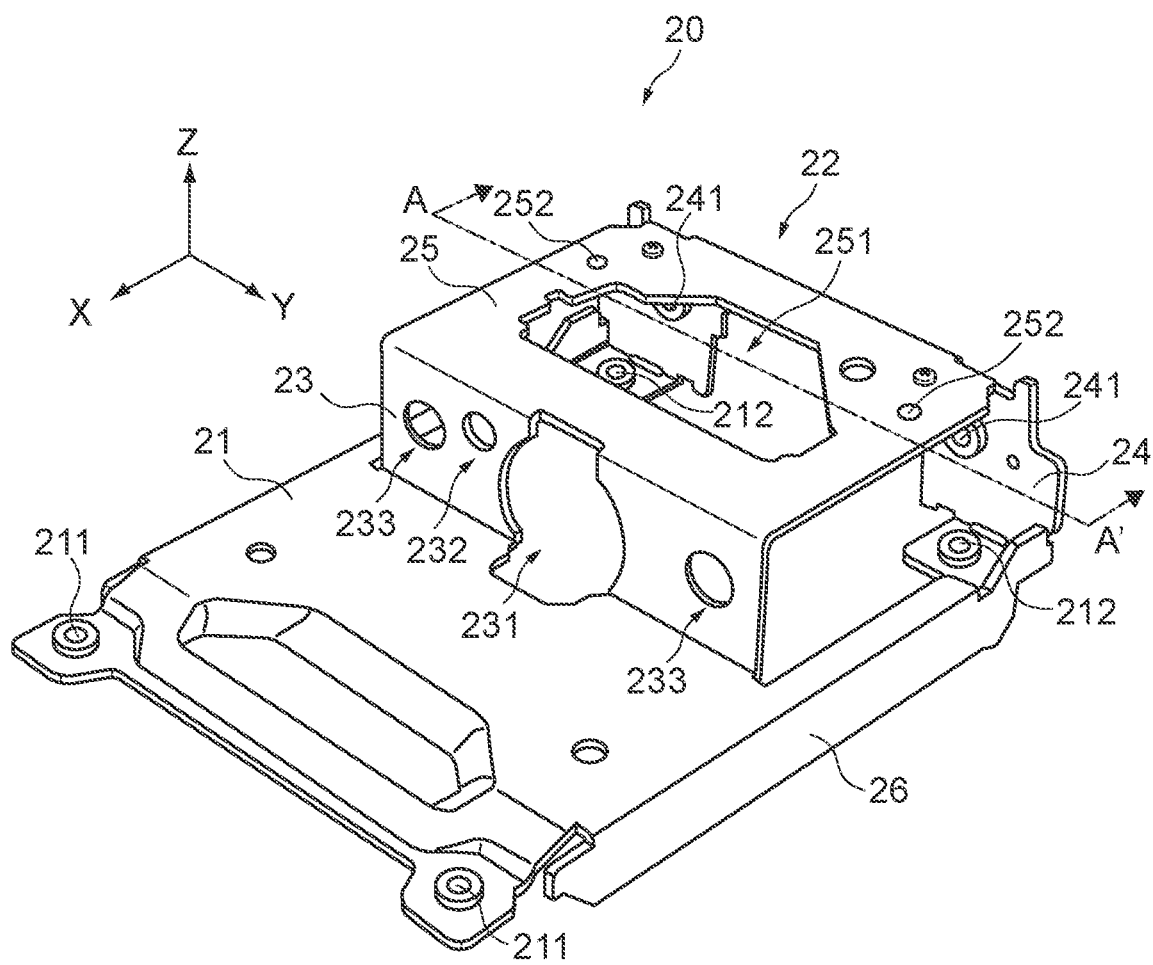
FIG. 5 is a perspective view of a frame of the vehicle-mounted camera.

FIG. 5 is a perspective view of the frame 20. The frame 20 is favorably a sheet metal processed product and is formed, for example, by applying plastic processing to a thin sheet material of metal such as stainless steel. The frame 20 includes a flat portion 21 extending along the X-Y plane, and a raised portion 22 raised upward in the Z-axis direction from the flat portion 21 within the housing portion 112 of the front case 11.

The raised portion 22 includes a front wall portion 23, a rear wall portion 24, and an upper wall portion 25. The front wall portion 23 and the rear wall portion 24 each have a flat plate shape extending along the Y-Z plane and face each other in the X-axis direction. The upper wall portion 25 has a flat plate shape extending along the X-Y plane and interconnects the upper end portions of the front wall portion 23 and the rear wall portion 24 in the Z-axis direction.

The front wall portion 23 includes, in the central portion in the Y-axis direction, a lens hole 231 penetrating in the X-axis direction. The lens hole 231 is disposed adjacent to the rear of the lens hole 113 of the front case 11 in the X-axis direction. The optical unit 141 of the imaging unit 14 is inserted into the lens hole 231 of the frame 20 and the lens hole 113 of the front case 11.

Additionally, the front wall portion 23 includes a through-hole portion 232 penetrating in the X-axis direction at a position adjacent to the lens hole 231. Further, the front wall portion 23 includes a pair of through-hole portions 233 penetrating in the X-axis direction in both end portions of the front wall portion 23 in the Y-axis direction. The through-hole portions 233 are used to fix the imaging unit 14 and the front case 11.

The upper wall portion 25 includes, in the central region, an opening 251 penetrating in the Z-axis direction. The opening 251 is widely opened so as to be accessible to the space within the raised portion 22 from the upper portion of the upper wall portion 25 in the Z-axis direction. Since the pressing member 15 is fitted into the opening 251, the edge of the opening 251 is formed in a shape corresponding to the pressing member 15.

Additionally, the frame 20 includes screw hole portions 211, 212, 241, and 252 for fixing each portion of the vehicle-mounted camera 1. The screw hole portions 211 and 212 are provided in the front and rear regions in the X-axis direction connected to the flat portion 21 and penetrate in the Z-axis direction. The screw hole portions 241 are provided to the rear wall portion 24 and penetrate in the X-axis direction. The screw hole portions 252 are provided to the upper wall portion 25 and penetrate in the Z-axis direction.

More specifically, the screw hole portions 211 are respectively provided at both end portions in the Y-axis direction of the front region of the flat portion 21 in the X-axis direction and are used to fix the main board 13 and the bottom case 12. The screw hole portions 212 are respectively provided at both end portions in the Y-axis direction of the rear region of the flat portion 21 in the X-axis direction and are used to fix the main board 13.

The screw hole portions 241 are respectively provided at both end portions in the Y-axis direction of the rear wall portion 24 and are used to fix the bottom case 12. The screw hole portions 252 are respectively provided at both end portions in the Y-axis direction of the upper wall portion 25 and are used to fix the shield plate 16. Each screw hole portion 211, 212, 241, or 252 is formed in a female screw shape corresponding to a screw member S to be used.

The screw member S to be used for fixing each member to each screw hole portion 211, 212, 241, or 252 can be arbitrarily determined. Typically, the screw member S is a male screw that is configured to be capable of being fastened by being screwed into each screw hole portion 211, 212, 241, or 252 while rotating a screwdriver engaged with the groove formed in the head of the screw member S.

Additionally, the frame 20 includes side plates 26 bent downward in the Z-axis direction from both edge portions of the flat portion 21 in the Y-axis direction. The side plate 26 has a flat plate shape extending along the X-Z plane and elongated in the X-axis direction. The side plate 26 is used to hold the shield plate 16 between itself and a side plate 123 of the bottom case 12, which will be described later.

Figure 6:
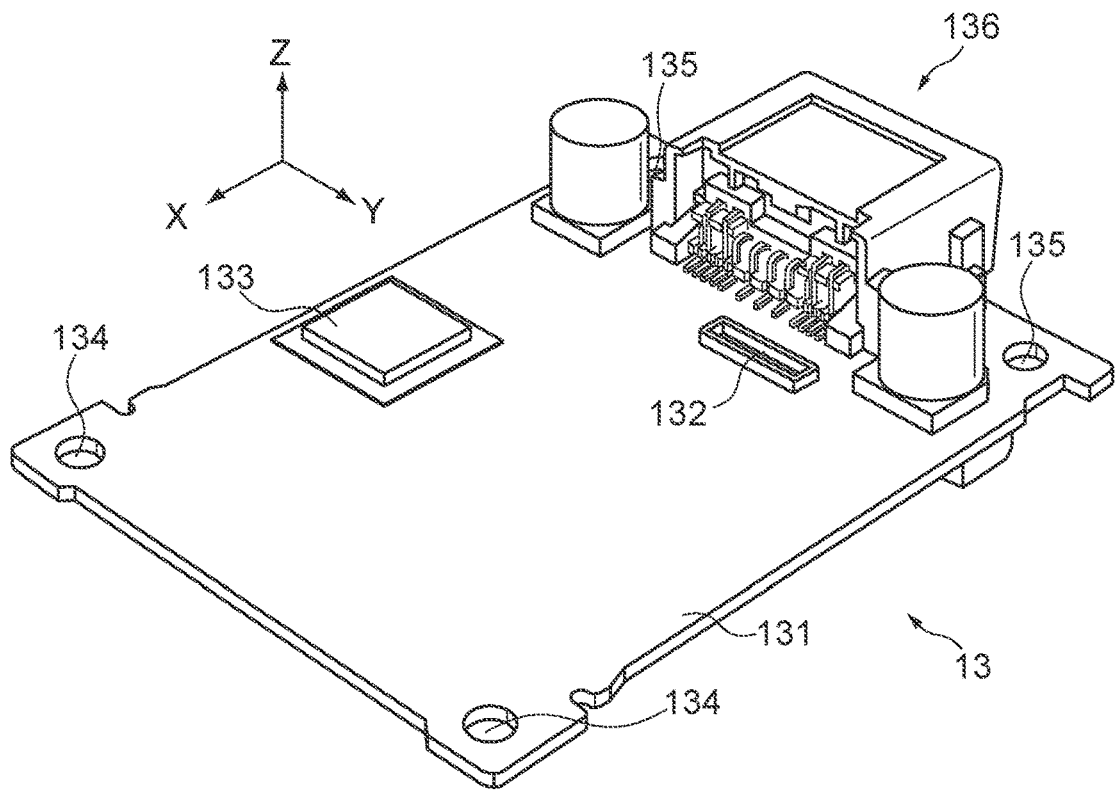
FIG. 6 is a perspective view of a main board of the vehicle-mounted camera.

FIG. 6 is a perspective view of the main board 13. The main board 13 includes a flat plate-shaped base material 131 extending along the X-Y plane. As the base material 131, various ceramic boards, various plastic boards, and the like can be used. The mounting surface of the base material 131 that faces upward in the Z-axis direction is provided with a terminal 132 to be connected to the imaging device board 142 of the imaging unit 14 to be described later.

Additionally, a micro controller unit (MCU) 133 and a power supply unit 136 are provided on the mounting surface of the base material 131. In addition to the above-described structural elements, electronic components necessary for implementing various functions of the vehicle-mounted camera 1 are further mounted on the mounting surface (both surfaces in the Z-axis direction) of the base material 131. Examples of such electronic components include various types of ICs, memories, drivers, and the like.

The base material 131 includes through-hole portions 134 and 135 penetrating in the Z-axis direction. The through-hole portions 134 are respectively provided at both end portions in the Y-axis direction of the front end portion in the X-axis direction and are fixed to the screw hole portions 211 of the frame 20. The through-hole portions 135 are respectively provided at both end portions in the Y-axis direction of the rear end portion in the X-axis direction and are fixed to the screw hole portions 212 of the frame 20.

Figure 7:
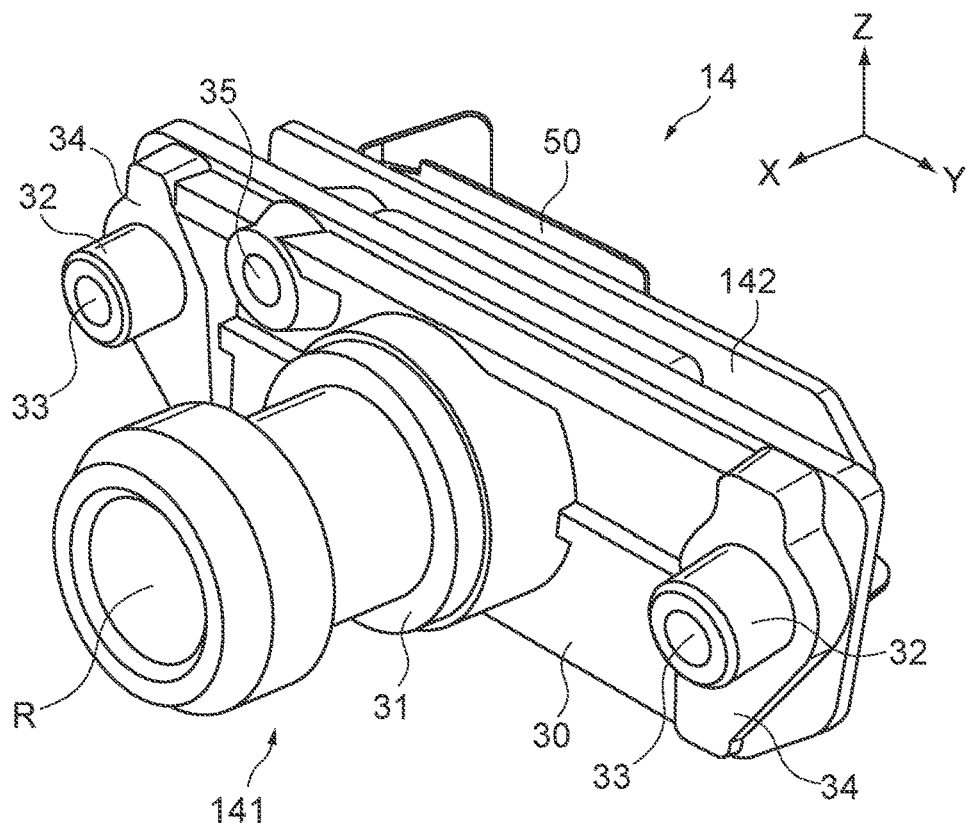
FIG. 7 is a perspective view of an imaging unit of the vehicle-mounted camera.

FIG. 7 is a perspective view of the imaging unit 14. The imaging unit 14 includes a holder 30, the optical unit 141, the imaging device board 142, and a flexible board 50. The holder 30 holds the optical unit 141 and the imaging device board 142. The flexible board 50 is connected to the imaging device board 142.

The optical unit 141 includes optical components such as a lens R having a common optical axis, and has a cylindrical shape extending along the optical axis direction. The holder 30 includes a holding portion 31 for holding the optical unit 141. The holding portion 31 is positioned at the center portion in the Y-axis direction and is configured as a substantially circular opening portion that holds the outer peripheral surface of the rear end portion of the optical unit 141 over the entire circumference without a gap.

Additionally, the holder 30 includes a pair of columnar portions 32 and a pair of screw hole portions 33. The columnar portions 32 are respectively provided at both end portions in the Y-axis direction of the front of the holder 30 facing forward in the X-axis direction and are formed in a columnar shape protruding forward in the X-axis direction. Each of the screw hole portions 33 is formed rearward from the distal end portion of each columnar portion 32 facing forward in the X-axis direction.

Further, the holder 30 includes a pair of regulating surfaces 34. Each of the regulating surfaces 34 extends around the rear end portion of each columnar portion 32 in the X-axis direction. Each regulating surface 34 is located on a common plane. In addition, the holder 30 further includes a screw hole portion 35 formed from the front side toward the rear in the Z-axis direction. The screw hole portion 35 is temporarily fixed to the through-hole portion 232 of the frame 20.

The columnar portions 32 and the regulating surfaces 34 of the holder 30 are used for positioning the imaging unit 14 and the front case 11 with respect to the frame 20. Therefore, the holder 30 needs to be formed in an accurate shape for accurate positioning of the imaging unit 14 and the front case 11. For that reason, a die-cast product of metal such as aluminum is favorably used as the holder 30. In this case, a cut surface of a metal die-cast is favorably used as the regulating surface 34 of the holder 30. Additionally, a resin molded product with high accuracy can also be used as the holder 30.

The imaging device board 142 has a flat plate shape along a plane orthogonal to the optical axis of the optical unit 141 and is disposed on the back surface of the holder 30. An imaging device is mounted on the mounting surface of the imaging device board 142 that faces forward in the X-axis direction. Thus, the light incident on the optical unit 141 from the external environment in front of the vehicle-mounted camera 1 can be made incident on the imaging device.

The imaging device mounted on the imaging device board 142 is not limited to a specific type. As the imaging device, for example, a charge coupled device (CCD) or a complementary metal oxide semiconductor (CMOS) can be used. As the base material of the imaging device board 142, various ceramic boards, various plastic boards, and the like can be used.

Note that it is particularly favorable that the vehicle-mounted camera 1 of the present technology have a configuration in which the imaging device has a size of 4.32 mm in height and 8.64 mm in width (a 1/1.7-type), the number of pixels of the imaging device is equal to or greater than several million (in particular, seven million pixels or more), and the tolerable range of a deviation of a focal position of the optical unit 141 is several micrometers (for example, ±3 micrometers). Further, it is also particularly favorable that the vehicle-mounted camera 1 of the present technology have a configuration in which the imaging device has a higher pixel density than the 1/1.7-type imaging device including seven million pixels, and the tolerable range of a deviation of the focal position of the optical unit 141 is several micrometers (for example, ±3 micrometers).

Additionally, in addition to the imaging device, other various components necessary for implementing the function of the imaging unit 14 can be mounted on the imaging device board 142. For example, a processing unit capable of performing image processing or the like can be mounted on the imaging device board 142. The flexible board 50 connects the imaging device board 142 and the terminal 132 of the main board 13 to each other.

Figure 8:
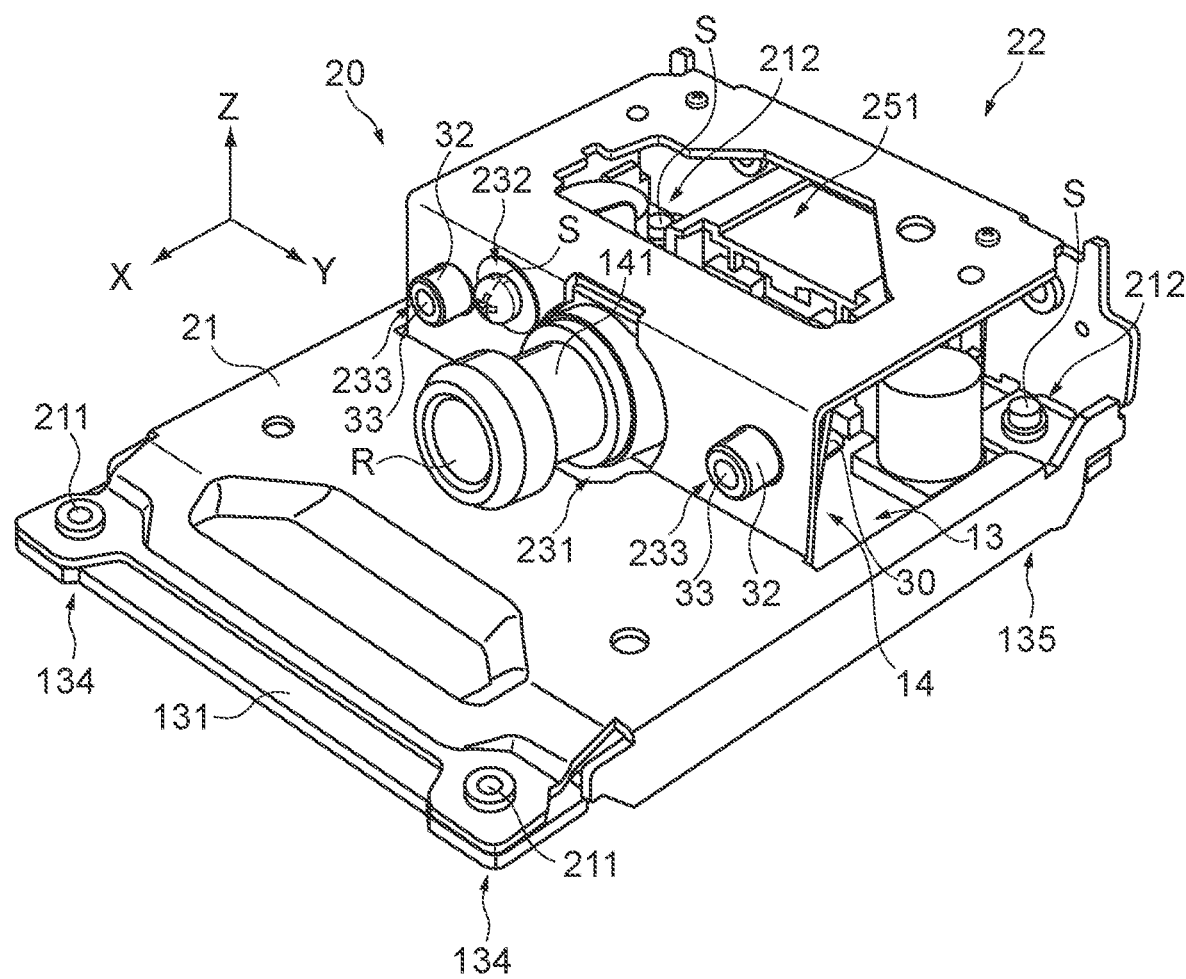
FIG. 8 is a perspective view showing a state of attaching the main board and the imaging unit of the vehicle-mounted camera to the frame.

FIG. 8 is a perspective view showing a state of attaching the main board 13 and the imaging unit 14 to the frame 20. The imaging unit 14 is attached to the front wall portion 23 of the frame 20 from the rear in the X-axis direction. At that time, the optical unit 141 is inserted into the lens hole 231 forward in the X-axis direction, and the columnar portions 32 are inserted into the through-hole portions 233 forward in the X-axis direction.

The imaging unit 14 is temporarily fixed to the frame 20 by fastening the screw member S, which is inserted into the through-hole portion 232 of the frame 20 from the front in the X-axis direction, to the screw hole portion 35 of the holder 30. Note that the vehicle-mounted camera 1 as a finished product does not need the screw member S for temporarily fixing the imaging unit 14 to the frame 20, but the screw member S may be left for the sake of convenience of the manufacturing process.

The main board 13 is fixed to the frame 20 by fastening the screw members S, which are inserted into the through-hole portions 135 from below in the Z-axis direction, to the screw hole portions 212 of the frame 20. Note that the through-hole portions 134 of the main board 13 are screwed to the screw hole portions 211 of the frame 20 in a subsequent step, and are thus not fixed to the frame 20 at this stage.

The flexible board 50 of the imaging unit 14 is connected to the terminal 132 of the main board 13 in the state shown in FIG. 8. The flexible board 50 is accessible through the opening 251 of the frame 20 from above in the Z-axis direction. Further, in the vehicle-mounted camera 1, the pressing member 15 is used for fixing the flexible board 50 onto the main board 13.

Figure 9:
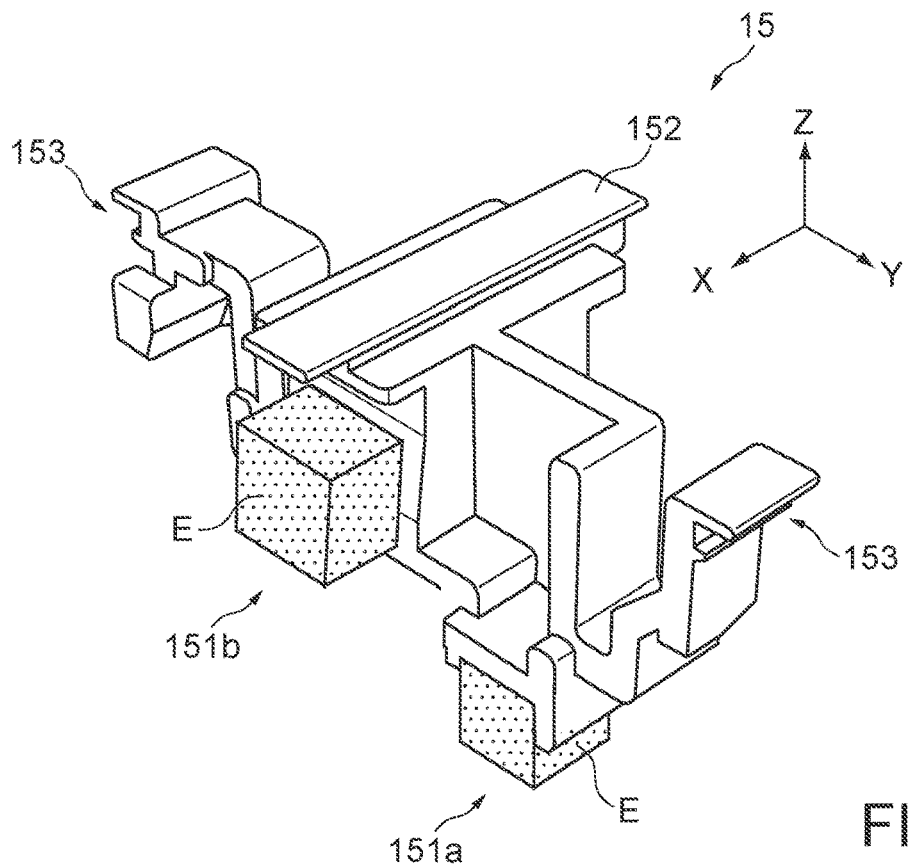
FIG. 9 is a perspective view of a pressing member of the vehicle-mounted camera.

FIG. 9 is a perspective view of the pressing member 15. The pressing member 15 is formed of, for example, a resin material. The pressing member 15 includes a pressing portion 151a facing downward in the Z-axis direction and a pressing portion 151b facing forward in the X-axis direction. A cushion material E is attached to each of the pressing portions 151a and 151b. The pressing member 15 presses one connection terminal portion of the flexible board 50 against the main board 13 by the pressing portion 151a, and presses the other connection terminal portion of the flexible board 50 against the imaging device board 142 by the pressing portion 151b. As a result, the flexible board 50 is fixed to the main board 13 and the imaging device board 142.

The pressing member 15 includes an engagement plate 152 and engagement pieces 153 provided at the upper portion in the Z-axis direction. The engagement plate 152 has a flat plate shape extending along the X-Y plane and elongated in the X-axis direction. The engagement pieces 153 are provided at both end portions in the Y-axis direction. Each of the engagement pieces 153 is formed of a pair of protruding pieces that are provided at an interval in the Z-axis direction and protrude outward in the Y-axis direction.

Figure 10:
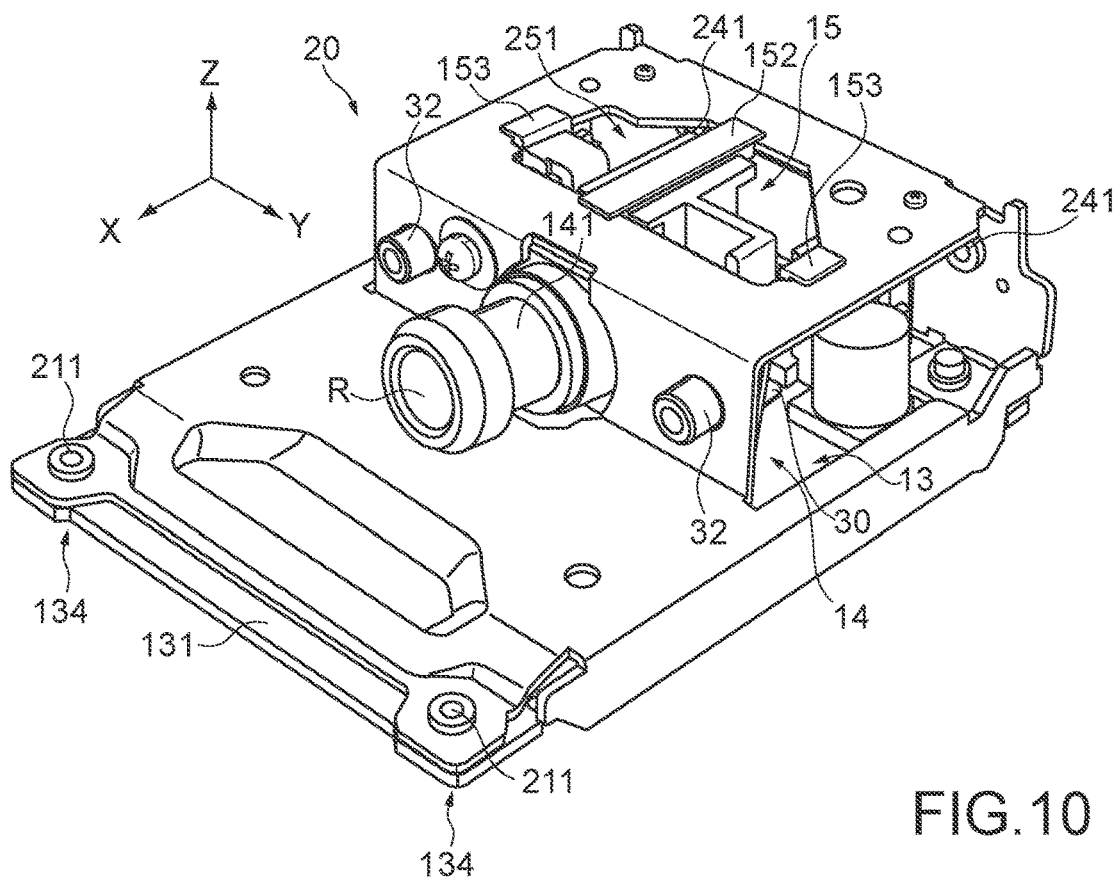
FIG. 10 is a perspective view showing a state of attaching the pressing member to the frame shown in FIG. 8.

FIG. 10 is a perspective view showing a state of attaching the pressing member 15 to the frame 20 shown in FIG. 8. The engagement plate 152 is engaged with the edge of the opening 251 from the upper side in the Z-axis direction and is stretched over the opening 251 in the X-axis direction. The engagement pieces 153 are fitted into the opening 251, i.e., sandwich the edge of the opening 251 with the pairs of protruding pieces from above and below in the Z-axis direction.

Thus, the pressing member 15 is fixed to the frame 20. The pressing member 15 is configured such that, in this state, the pressing portions 151a and 152b appropriately press the respective connection terminal portions of the flexible board 50. Thus, in the vehicle-mounted camera 1, the connection between the imaging device board 142 and the main board 13 by the flexible board 50 can be more reliably held.

Figure 11:
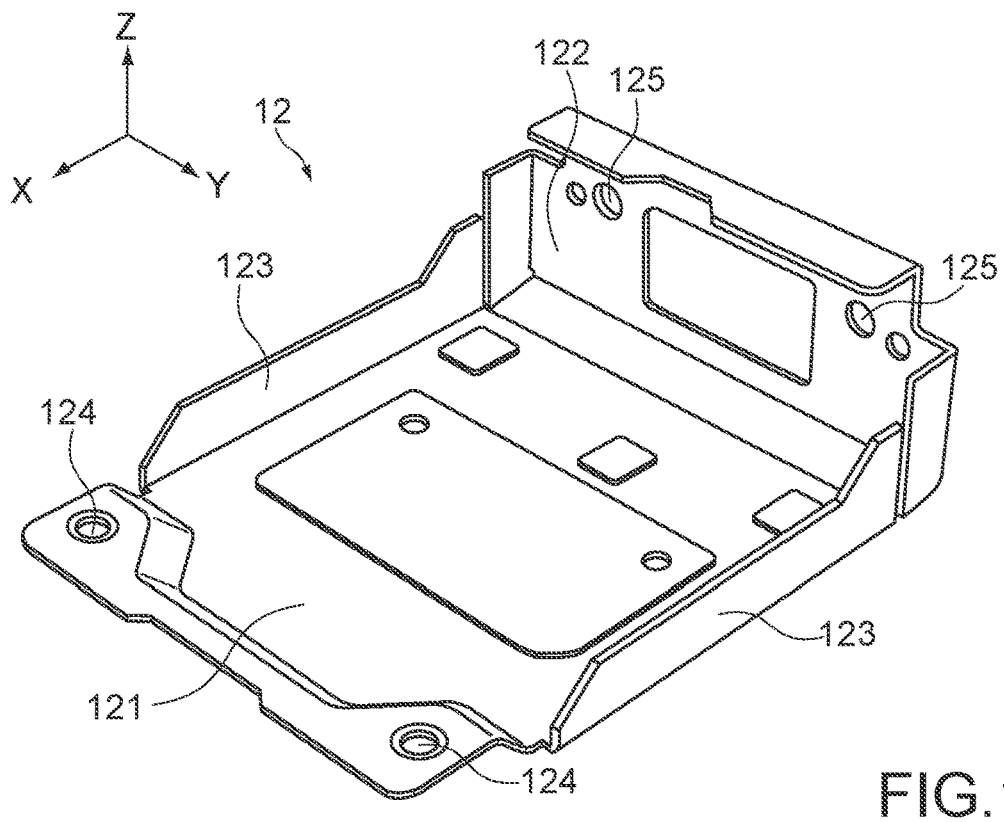
FIG. 11 is a perspective view of a bottom case of the vehicle-mounted camera.

FIG. 11 is a perspective view of the bottom case 12. The bottom case 12 is formed, for example, by applying plastic processing to a thin plate material of metal such as aluminum. The bottom case 12 includes a bottom plate 121 that constitutes the bottom surface of the vehicle-mounted camera 1, and a back plate 122 and side plates 123 that are bent from the edge portion of the bottom plate 121.

The bottom plate 121 has a planar plate shape extending along the X-Y plane. The back plate 122 has a flat plate shape extending along the Y-Z plane and extends upward in the Z-axis direction from a rear end portion of the bottom plate 121 in the X-axis direction. The side plates 123 each have a flat plate shape extending along the X-Z plane and extend upward in the Z-axis direction from both end portions of the bottom plate 121 in the Y-axis direction.

The bottom plate 121 includes through-hole portions 124 penetrating in the Z-axis direction, which are respectively formed at both end portions in the Y-axis direction of the front end portion in the X-axis direction. The back plate 122 includes through-hole portions 125 penetrating in the X-axis direction, which are respectively formed at both end portions in the Y-axis direction. Both the through-hole portions 124 and 125 are used to fix the bottom case 12 to the frame 20.

Figure 12:
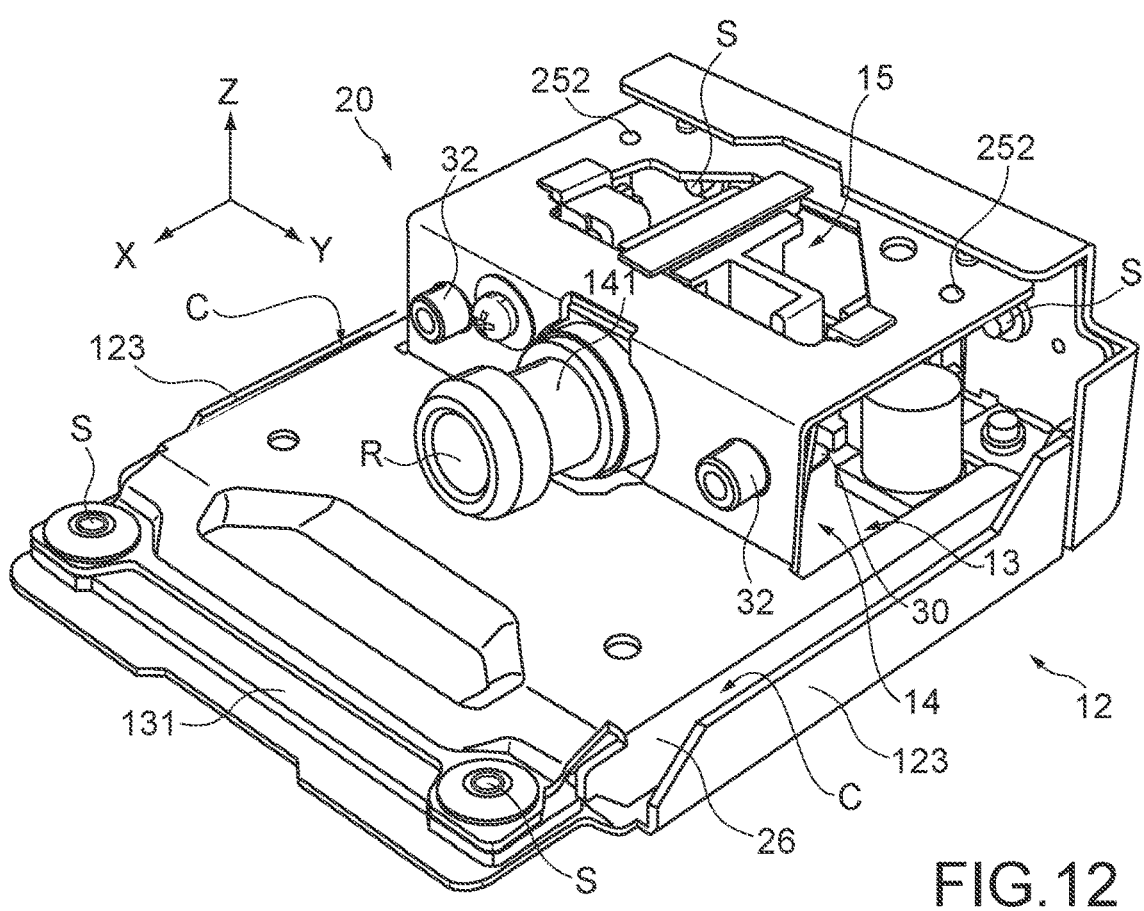
FIG. 12 is a perspective view showing a state of attaching the bottom case to the frame shown in FIG. 10.

FIG. 12 is a perspective view showing a state of attaching the bottom case 12 to the frame 20 shown in FIG. 10. In the state shown in FIG. 12, the through-hole portion 124 of the bottom case 12, the through-hole portion 134 of the main board 13, and the screw hole portion 211 of the frame 20 overlap in the Z-axis direction to form a continuous through hole.

The bottom case 12 is fixed to the frame 20 by fastening the screw members S, which are inserted into the through-hole portions 125 from the rear in the X-axis direction, to the screw hole portions 241 of the frame 20. Additionally, the bottom case 12 is fixed to the frame 20 by fastening the screw members S, which are inserted into the through-hole portions 124 and 134 from below in the Z-axis direction, to the screw hole portions 211 of the frame 20.

The main board 13 sandwiched between the frame 20 and the bottom case 12 is also fixed to the frame 20 by the fastening of the screw members S to the screw hole portions 211 of the frame 20. Thus, the bottom case 12 and the main board 13 are stably fixed to the frame 20 in two spots each in the front and rear in the X-axis direction.

The side plate 26 of the frame 20 is disposed inside the side plate 123 of the bottom case 12 in the Y-axis direction. Thus, a gap C in the Y-axis direction is formed between the side plate 26 of the frame 20 and the side plate 123 of the bottom case 12. The shield plate 16 is incorporated in the gap C between the side plates 26 and 123.

Figure 13:
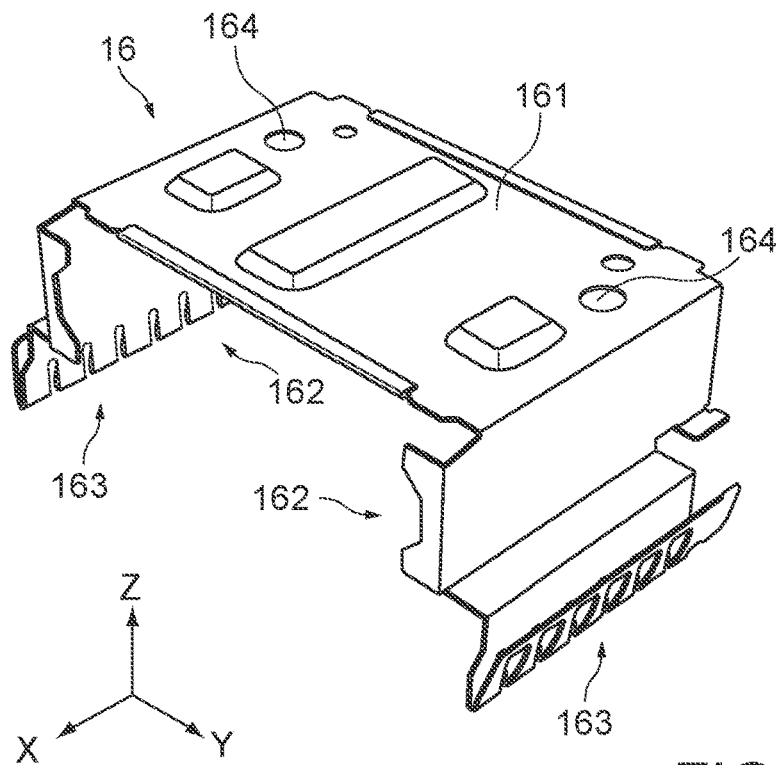
FIG. 13 is a perspective view of a shield plate of the vehicle-mounted camera.

FIG. 13 is a perspective view of the shield plate 16. The shield plate 16 is formed, for example, by adding plastic processing to a thin plate material of metal such as stainless steel. The shield plate 16 includes a top plate 161, side plates 162, and leaf spring portions 163. The shield plate 16 has a substantially U-shaped cross section along the Y-Z plane.

The top plate 161 extends along the X-Y plane. The side plates 162 extend along the X-Z plane and extend downward in the Z-axis direction from both end portions of the top plate 161 in the Y-axis direction. The top plate 161 covers the raised portion 22 of the frame 20 from above in the Z-axis direction and closes the opening 251. The side plates 162 cover the space within the raised portion 22 of the frame 20 from both sides in the Y-axis direction.

The top plate 161 includes through-hole portions 164 penetrating in the Z-axis direction, which are formed respectively at both end portions in the Y-axis direction. The leaf spring portions 163 extend downward in the Z-axis direction further from the respective side plates 162 and are bent in a V-shape outward in the Y-axis direction. Both the through-hole portions 164 and the leaf spring portions 163 are used to fix the shield plate 16 to the frame 20.

Figure 14:
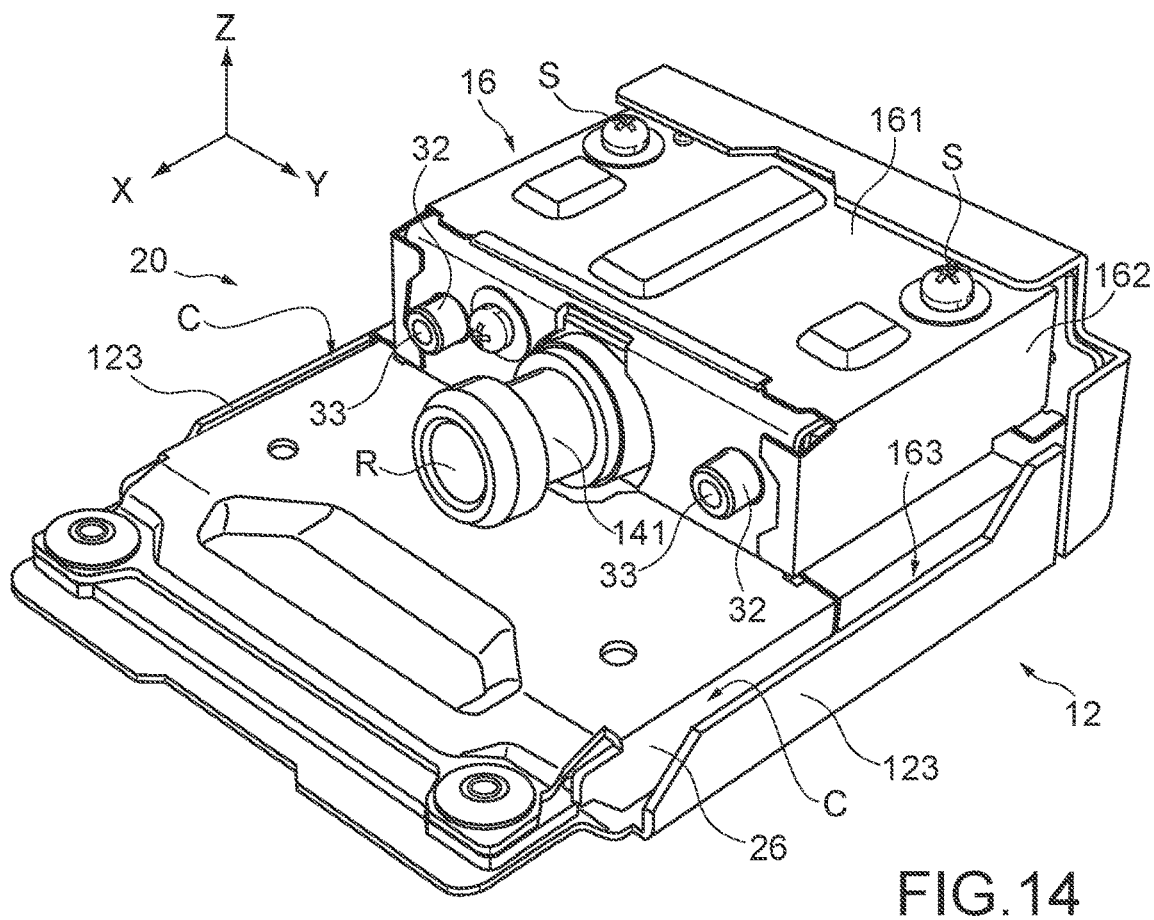
FIG. 14 is a perspective view showing a state of attaching the shield plate to the frame shown in FIG. 12.

FIG. 14 is a perspective view showing a state of attaching the shield plate 16 to the frame 20 shown in FIG. 12. In the state shown in FIG. 14, the leaf spring portion 163 is incorporated in the gap C between the side plates 26 and 123. Thus, the leaf spring portion 163 is fixed while being sandwiched between the side plates 26 and 123 in a state of being compressively deformed in the Y-axis direction.

Additionally, the shield plate 16 is fixed to the frame 20 by fastening the screw members S, which are inserted into the through-hole portions 164 from above in the Z-axis direction, to the screw hole portions 252 of the frame 20. Thus, the electronic components within the raised portion 22 are electromagnetically shielded from the external environment by the frame 20, the shield plate 16, and the bottom case 12 that are formed of metal.

Figure 15:
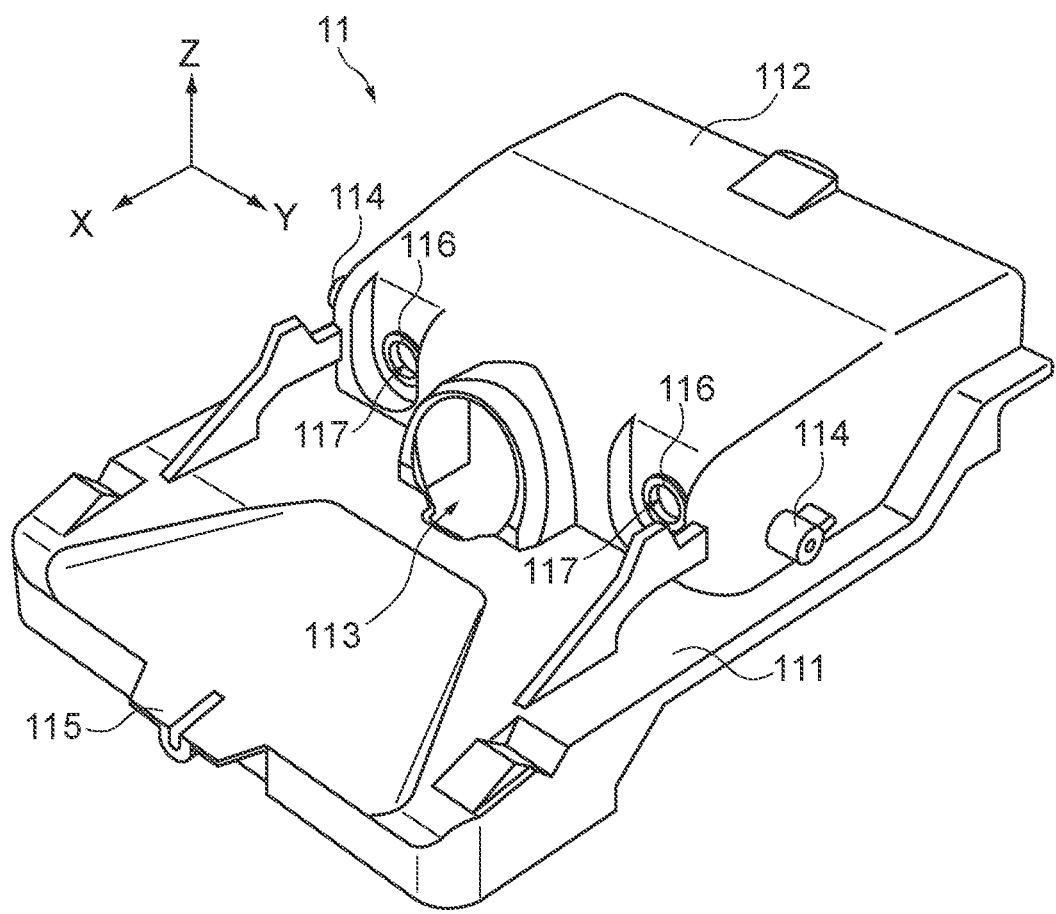
FIG. 15 is a perspective view of a front case of the vehicle-mounted camera.

FIG. 15 is a perspective view of the front case 11. The housing portion 112 includes a pair of boss portions 116 respectively protruding in the X-axis direction at both end portions of the front in the Y-axis direction. A pair of through-hole portions 117 penetrating in the X-axis direction are formed in the pair of boss portions 116. The through-hole portions 117 are used to fix the front case 11 to the frame 20.

The front case 11 is attached to the frame 20 shown in FIG. 14. The front case 11 is placed on the bottom case 12. At that time, the optical unit 141 of the imaging unit 14 is inserted into the lens hole 113 from the rear in the X-axis direction, and the columnar portions 32 of the holder 30 of the imaging unit 14 are inserted into the respective through-hole portions 117 from the rear in X-axis direction.

The screw members S inserted into the through-hole portions 117 from the front in the X-axis direction are then fastened to the screw hole portions 33 formed in the columnar portions 32 of the holder 30. Thus, the frame 20 is sandwiched between the front case 11 and the regulating surfaces 34 of the holder 30, and thus the imaging unit 14 and the front case 11 are fixed to the frame 20.

As described above, the vehicle-mounted camera 1 shown in FIG. 2 is completed. In the state shown in FIG. 2, positioning is performed by the pair of columnar portions 32 of the holder 30 to be inserted into the through-hole portions 233 of the frame 20 and the through-hole portions 117 of the front case 11. Thus, in the vehicle-mounted camera 1, it is possible to direct the optical axis of the optical unit 141 of the imaging unit 14 in an accurate direction.

The screw members S used for fixing the front case 11 and the holder 30 to the frame 20 are arbitrarily selectable from male screws each having a head engageable with the boss portion 116. As the screw member S, in addition to a cross-slot screw and a slotted screw having a groove formed in the head, for example, a hexagonal bolt having the head of a hexagonal shape is available.

As described above, the front case 11 is fixed to the frame 20 only in the through-hole portions 117 of the two boss portions 116. Thus, in the vehicle-mounted camera 1, stress is hardly applied to the frame 20 and the imaging unit 14 when the front case 11 is attached. Therefore, in the vehicle-mounted camera 1, the optical axis of the optical unit 141 of the imaging unit 14 is hardly shifted.

Additionally, it is not necessary to provide a screw hole portion in the front case 11. Thus, in the vehicle-mounted camera 1, the front case 11 can be a resin molded product.

This makes it possible to achieve cost reduction and weight reduction in the vehicle-mounted camera 1. In addition, the through-hole portions 117 of the boss portions 116 to be positioned by the columnar portions 32 of the holder 30 can be formed in an accurate shape.

The vehicle-mounted camera 1 according to this embodiment has a configuration in which the stress to be applied to the flexible board 50 that connects the main board 13 and the imaging device board 142 of the imaging unit 14 is successfully absorbed regardless of the direction of the stress. This makes it difficult to apply a load to the flexible board 50. Hereinafter, a detailed configuration of the flexible board 50 will be described.

[Detailed Configuration of Flexible Board 50]

Figure 16:
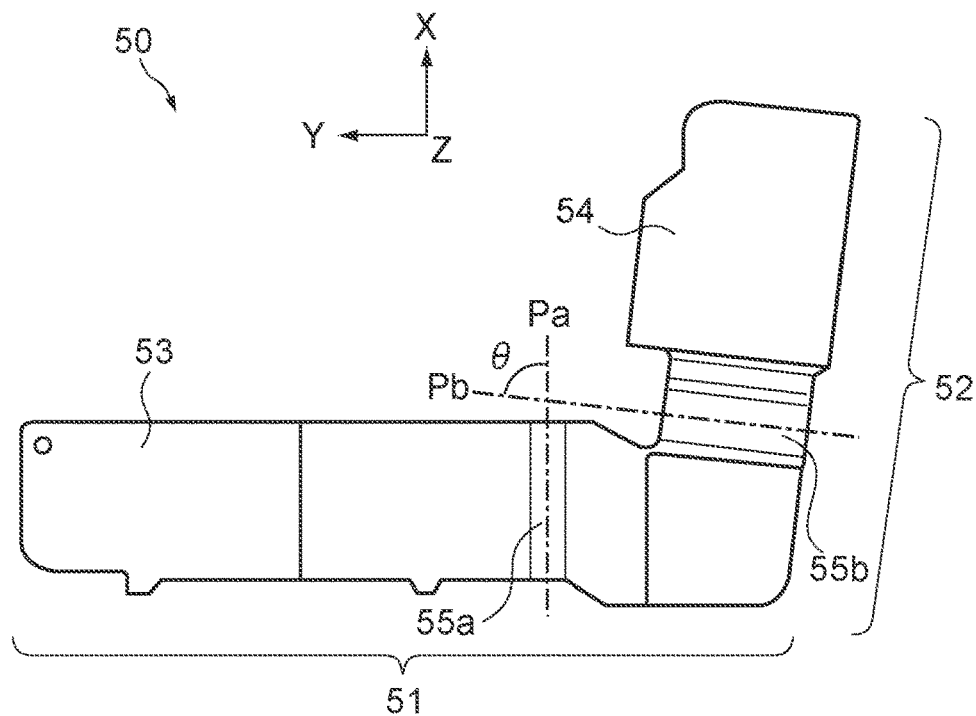
FIG. 16 is a development view of a flexible board of the imaging unit.
Figure 17:
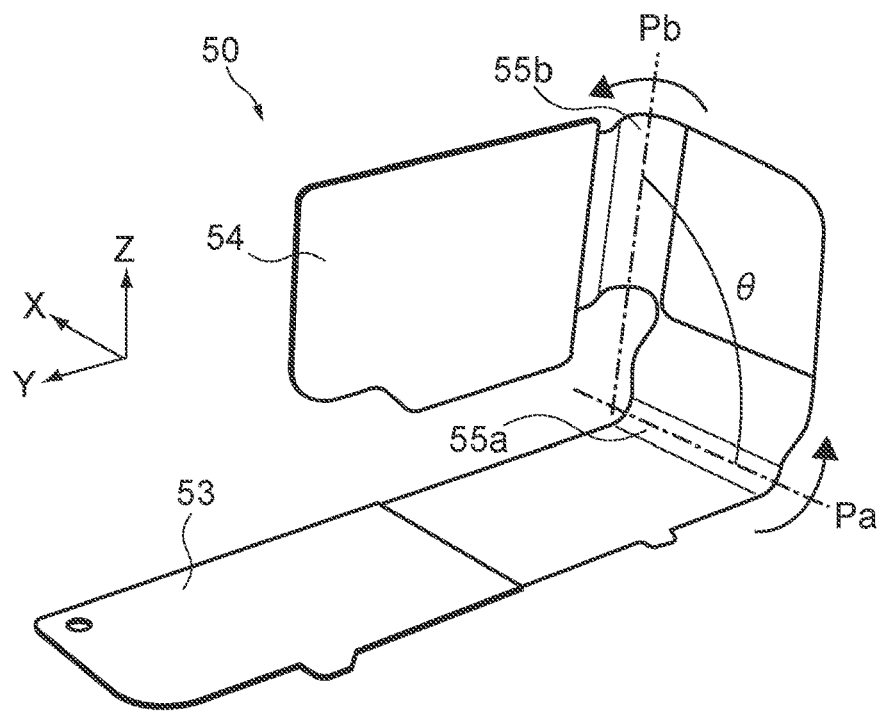
FIG. 17 is a perspective view of the flexible board.

FIGS. 16 and 17 show the flexible board 50 according to this embodiment. FIG. 16 is a plan view showing a developed state in which the flexible board 50 is developed along the X-Y plane. FIG. 17 is a perspective view showing a bent state in which the flexible board 50 in the developed state shown in FIG. 16 is bent so as to be connectable to the main board 13 and the imaging device board 142.

The flexible board 50 is formed of, for example, a resin such as polyimide or polyester. As shown in FIG. 16, the flexible board 50 in the developed state includes a strip-shaped first extension portion 51 and a strip-shaped second extension portion 52 extending in mutually intersecting directions, and has a substantially L-shaped planar shape bent between the first extension portion 51 and the second extension portion 52.

The flexible board 50 includes a first connection portion 53 that is a connection terminal portion to be connected to the main board 13, and a second connection portion 54 that is a connection terminal portion to be connected to the imaging device board 142. The connection portions 53 and 54 are respectively provided at both end portions of the flexible board 50. The first connection portion 53 is located in the first extension portion 51, and the second connection portion 54 is located in the second extension portion 52.

In the flexible board 50, the wiring provided along the first extension portion 51 and the second extension portion 52 connects the first connection portion 53 and the second connection portion 54 to each other. This allows the flexible board 50 to electrically connect the main board 13 and the imaging device board 142 to each other, the main board 13 being to be connected to the first connection portion 53, the imaging device board 142 being to be connected to the second connection portion 54.

Additionally, the flexible board 50 includes a first bending portion 55a and a second bending portion 55b provided between the connection portions 53 and 54. The first bending portion 55a is provided to the first extension portion 51 and is bendable along a first bending axis Pa. The second bending portion 55b is provided to the second extension portion 52 and is bendable along a second bending axis Pb.

Typically, the first bending axis Pa of the first bending portion 55a extends in a direction orthogonal to the extending direction of the first extension portion 51. Additionally, the second bending axis Pb of the second bending portion 55b extends in a direction orthogonal to the extending direction of the second extension portion 52. Therefore, as shown in FIG. 16, in the flexible board 50 in the developed state, the first bending axis Pa and the second bending axis Pb cross each other.

The flexible board 50 is bent into an R shape at the bending portions 55a and 55b. More specifically, the flexible board 50 is bent such that the first bending portion 55a is bent upward in the Z-axis direction and the second bending portion 55b is further bent inward in the Y-axis direction from the developed state shown in FIG. 16. As a result, the flexible board 50 is in the bent state shown in FIG. 17.

Figure 18:
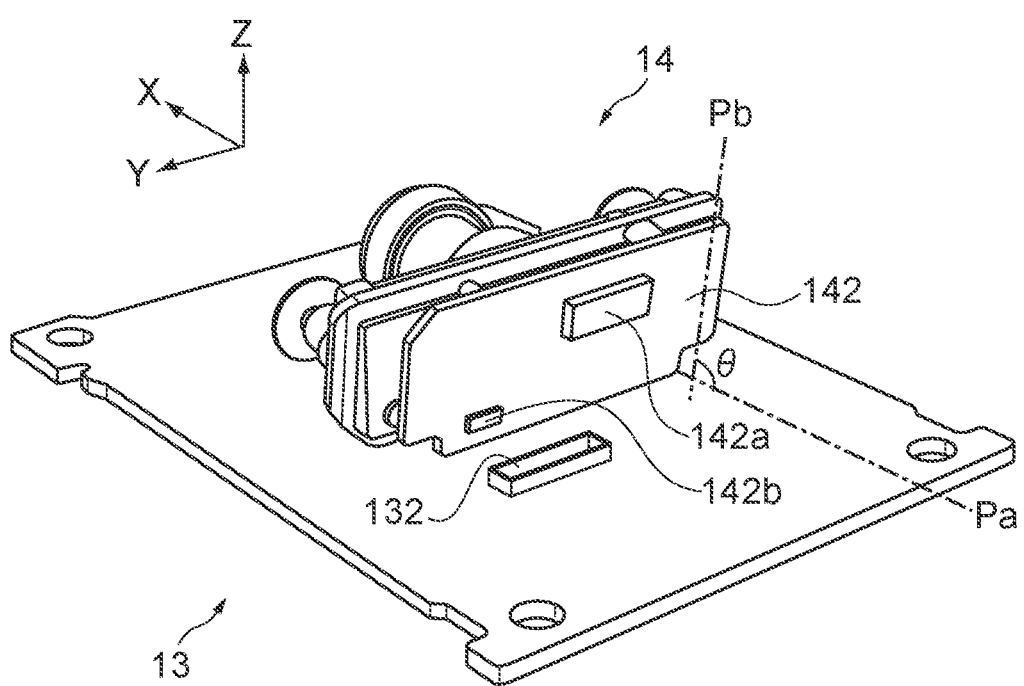
FIG. 18 is a perspective view of the main board and the imaging unit.

FIG. 18 is a perspective view showing a state in which the imaging unit 14 is placed on the main board 13. The imaging device board 142 of the imaging unit 14 includes a terminal 142a mounted on a mounting surface facing rearward in the Z-axis direction. The terminal 142a of the imaging device board 142 is electrically connected to the terminal 132 of the main board 13 via the flexible board 50.

That is, the first connection portion 53 is connected to the terminal 132 of the main board 13, and the second connection portion 54 is connected to the terminal 142a of the imaging device board 142. In the flexible board 50 in the bent state shown in FIG. 17, the relative positions of the first connection portion 53 and the second connection portion 54 substantially coincide with the relative positions of the terminal 132 of the main board 13 and the terminal 142a of the imaging device board 142, respectively.

Thus, in the flexible board 50, the first connection portion 53 and the second connection portion 54 can be respectively connected to the terminal 132 of the main board 13 and the terminal 142a of the imaging device board 142 without force. Therefore, in the vehicle-mounted camera 1, the connection between the main board 13 and the imaging device board 142 by the flexible board 50 can be easily performed.

Additionally, the bending portions 55a and 55b are flexibly deformable except for the directions along the bending axes Pa and Pb. Thus, the bending portions 55a and 55b can respectively absorb, by deformation, the stress applied to the flexible board 50 connected to the main board 13 and the imaging device board 142 in directions other than the directions along the bending axes Pa and Pb.

In the flexible board 50, since the bending axes Pa and Pb intersect with each other at the angle θ in the developed state, the directions in which the bending portions 55a and 55b are hardly deformed are made different from each other in the bent state. As a result, in the vehicle-mounted camera 1, the bending portions 55a and 55b can absorb the stress applied to the flexible board 50 in all directions.

Thus, in the vehicle-mounted camera 1, even when the positions of the terminal 132 of the main board 13 and the terminal 142a of the imaging device board 142 are shifted in any direction, the load is hardly applied to the flexible board 50. Thus, in the vehicle-mounted camera 1, the connection between the main board 13 and the imaging device board 142 is successfully ensured, and high reliability is obtained.

Additionally, in the flexible board 50, the bending portions 55a and 55b can absorb the stress applied at the time of manufacturing the vehicle-mounted camera 1, the stress applied due to physical shock, thermal expansion, and the like at the time of using the vehicle-mounted camera 1, and other stress. As a result, higher reliability can be obtained in the vehicle-mounted camera 1.

In the vehicle-mounted camera 1, the angle θ between the bending axes Pa and Pb is favorably determined in accordance with the inclination between the main board 13 and the imaging device board 142. That is, in the configuration shown in FIG. 17, the angle formed between the first connection portion 53 and the second connection portion 54 (the angle 6 between the bending axes Pa and Pb) is favorably the same as the angle formed between the main board 13 and the imaging device board 142. Thus, since the bending portions 55a and 55b of the flexible board 50 attached to the main board 13 and the imaging device board 142 can be deformed without force, the stress applied to the flexible board 50 is more effectively absorbed.

The angle formed between the main board 13 and the imaging device board 142 is set on the basis of the angle of the windshield M01, which is set for each vehicle type of the automobile M. Thus, when the angle θ between the bending axes Pa and Pb is the same as the angle formed between the main board 13 and the imaging device board 142, the angle θ between the bending axes Pa and Pb is also based on the angle of the windshield M01 set for each vehicle type of the automobile M.

Additionally, in the flexible board 50, the direction of the connection path between the connection portions 53 and 54 can be three-dimensionally changed twice by the bending portions 55a and 55b. As a result, in the vehicle-mounted camera 1, the connection path between the connection portions 53 and 54 in the flexible board 50 can be freely determined in accordance with the arrangement of other electronic components or the like.

As an example, in the vehicle-mounted camera 1, the connection path between the connection portions 53 and 54 in the flexible board 50 can be determined in consideration of the position of a crystal oscillator 142b for controlling the imaging device. As shown in FIG. 18, the crystal oscillator 142b is mounted in a region on the left side in the Y-axis direction of the mounting surface of the imaging device board 142 facing rearward in the X-axis direction.

The crystal oscillator 142b includes a crystal resonator. The crystal resonator of the crystal oscillator 142b may cause crosstalk with the signal flowing through the flexible board 50. When such crosstalk occurs in the vehicle-mounted camera 1, the clock generated by the crystal oscillator 142b is not stable, or noise is superimposed on the signal line, and thus an abnormality may occur in the image generated by the imaging device.

Thus, in the vehicle-mounted camera 1, it is favorable not to dispose the flexible board 50 near the crystal oscillator 142b in order to obtain a normal image. Therefore, in the vehicle-mounted camera 1, the flexible board 50 connects the main board 13 and the imaging device board 142 via a connection path that does not pass near the crystal oscillator 142b.

More specifically, the flexible board 50 shown in FIG. 17 is, in the state of being attached to the main board 13 and the imaging device board 142 shown in FIG. 18, pulled out rightward in the Y-axis direction from the second connection portion 54 connected to the terminal 142a so as not to pass through a region on the left side of the terminal 142a in the Y-axis direction, in which the crystal oscillator 142b is disposed.

Thus, in the vehicle-mounted camera 1, since the crosstalk is less likely to occur between the crystal resonator of the crystal oscillator 142b and the signal flowing through the flexible board 50, it is possible to prevent the occurrence of an abnormality in the image generated by the imaging device. Note that the configuration of the flexible board 50 can also be configured in consideration of the positions of the electronic components other than the crystal oscillator 142b in the imaging device board 142.

Additionally, in the flexible board 50, the relative positions of the connection portions 53 and 54 can be arbitrarily changed by changing the dimensions of the extension portions 51 and 52, the positions of the bending portions 55a and 55b, and the like. Thus, in the vehicle-mounted camera 1, the position of the terminal 132 of the main board 13, the position of the terminal 142a of the imaging device board 142, and the connection path of the flexible board 50 can be arbitrarily determined.

In particular, in the vehicle-mounted camera 1, since the effective utilization of the internal space is essential for miniaturization, the degrees of freedom in the position of the terminal 132 of the main board 13, the position of the terminal 142a of the imaging device board 142, and the connection path of the flexible board 50 are significantly limited. The flexible board 50 is capable of responding to such requests associated with the miniaturization of the vehicle-mounted camera 1.

Figure 19:
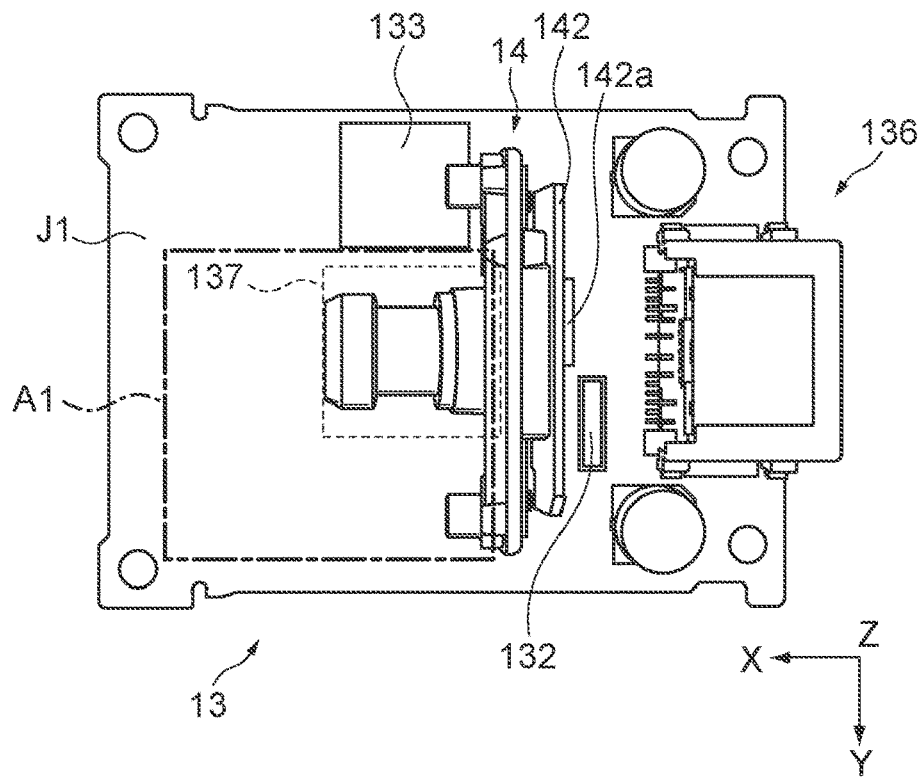
FIG. 19 is a plan view of the main board and the imaging unit.
Figure 20:
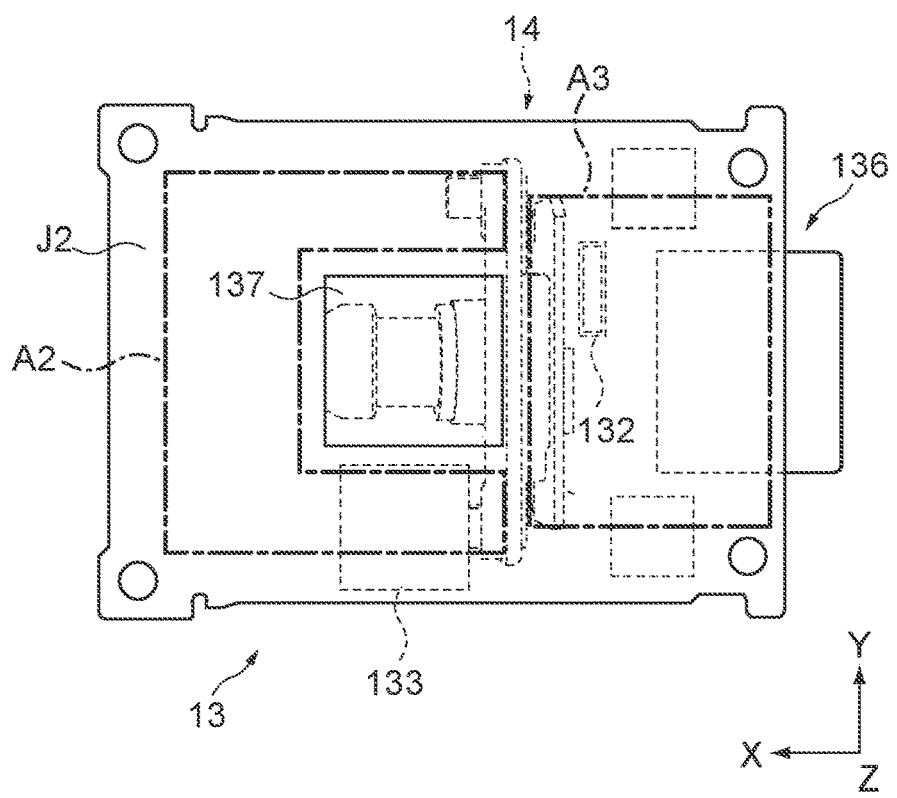
FIG. 20 is a bottom view of the main board and the imaging unit.

As an example, the position of the terminal 132 of the main board 13 in the vehicle-mounted camera 1 will be described. FIGS. 19 and 20 show a configuration on the mounting surface of the main board 13. FIG. 19 is a plan view showing a first mounting surface J1 of the main board 13 on the upper side in the Z-axis direction. FIG. 20 is a bottom view showing a second mounting surface J2 of the main board 13 on the lower side in the Z-axis direction.

The imaging unit 14 is disposed in the central region on the first mounting surface J1 of the main board 13 shown in FIG. 19. Additionally, the power supply unit 136 is disposed in the rear portion of the first mounting surface J1 in the X-axis direction. Further, in front of the imaging unit 14 in the X-axis direction on the first mounting surface J1, the MCU 133 is disposed and a first region Al surrounded by a dashed line is disposed.

A sensing IC 137 is mounted on the second mounting surface J2 of the main board 13 shown in FIG. 20. Since the sensing IC 137 is connected to many electronic components such as the MCU 133, the sensing IC 137 is disposed in the central area. The sensing IC 137 performs various analysis processes of the vehicle-mounted camera 1 (object detection, distance-measurement to an object, forward collision warning, lane keeping, and the like).

The MCU 133 has a function of converting a sensing result transmitted from the sensing IC 137 by serial communication into controller area network (CAN) data. Additionally, the MCU 133 also has a function of monitoring the operation of the sensing IC 137 and, in the event of an abnormality, resetting the sensing IC 137 by stopping the energization by the power supply unit 136.

Additionally, on the second mounting surface J2 of the main board 13 shown in FIG. 20, a second region A2 and a third region A3 each surrounded by a dashed line are disposed. The second region A2 is disposed so as to surround the front in the X-axis direction and the lateral sides in the Y-axis direction of the sensing IC 137. The third region A3 is disposed behind the sensing IC 137 in the X-axis direction.

Note that in each of FIGS. 19 and 20, the outline of the configuration on the opposite-side mounting surface J1 or J2 is indicated by a broken line. That is, in FIG. 19, the sensing IC 137 disposed on the second mounting surface J2 is indicated by a broken line. In FIG. 20, the terminal 132, the imaging unit 14, the MCU 133, and the power supply unit 136 disposed on the first mounting surface J1 are indicated by broken lines.

The first region A1 of the first mounting surface J1 of the main board 13 shown in FIG. 19 is located just in the back of the sensing IC 137. Thus, many bypassing capacitors required for a stable operation of the sensing IC 137 are disposed in the first region A1. Additionally, a bypass capacitor for the power supply unit 136 is also disposed in the first region A1.

A plurality of double data rate (DDR) memories is mounted in the second region A2 of the second mounting surface J2 of the main board 13 shown in FIG. 20. The plurality of DDR memories needs to be connected to the sensing IC 137 by isometric wiring as short as possible, and thus needs to be disposed in the second region A2 surrounding the sensing IC 137.

Additionally, in the second region A2 of the second mounting surface J2 of the main board 13, other electronic components connected to the sensing IC 137 are disposed. Other electronic components disposed in the second region A2 of the second mounting surface J2 include various memories other than the DDR memories, such as flash memories, various power storage components such as capacitors, and the like.

The third region A3 of the second mounting surface J2 of the main board 13 is located just in the back of the power supply unit 136. Since the power supply unit 136 is often a high and large component, it is difficult to ensure a region of the first mounting surface J1, in which a driver can be connected to the power supply unit 136 in a short distance. Thus, the driver of the power supply unit 136 is inevitably disposed in the third region A3 of the second mounting surface J2.

Additionally, electronic components other than the driver related to the power supply unit 136 are also disposed in the third region A3 of the second mounting surface J2 of the main board 13. Further, in addition to the electronic components related to the power supply unit 136, for example, a CAN driver for processing CAN data generated by the MCU 133 or the like is disposed in the third region A3 of the second mounting surface J2.

In such a manner, various electronic components are densely disposed on the first mounting surface J1 and the second mounting surface J2 of the main board 13. Thus, in the main board 13, the place capable of disposing the terminal 132 to be connected to the first connection portion 53 of the flexible board 50 is left only in the region behind the imaging device board 142 in the X-axis direction on the first mounting surface J1 shown in FIG. 19.

Additionally, in the vehicle-mounted camera 1, in order to achieve further miniaturization and high functionality, the region capable of disposing the terminal 132 of the main board 13 is increasingly limited. In this regard, the flexible board according to this embodiment can have a configuration in which the main board 13 and the imaging device board 142 can be easily connected to each other regardless of the position of the terminal 132 of the main board 13.

Note that the flexible board 50 according to this embodiment is not limited to the above-described configuration and may have any configuration as long as it includes the first bending portion 55a and the second bending portion 55b that are respectively bent along the first bending axis Pa and the second bending axis Pb intersecting with each other in the developed state. As an example, the flexible board 50 may have a configuration shown in FIGS. 21 and 22.

Figure 21:
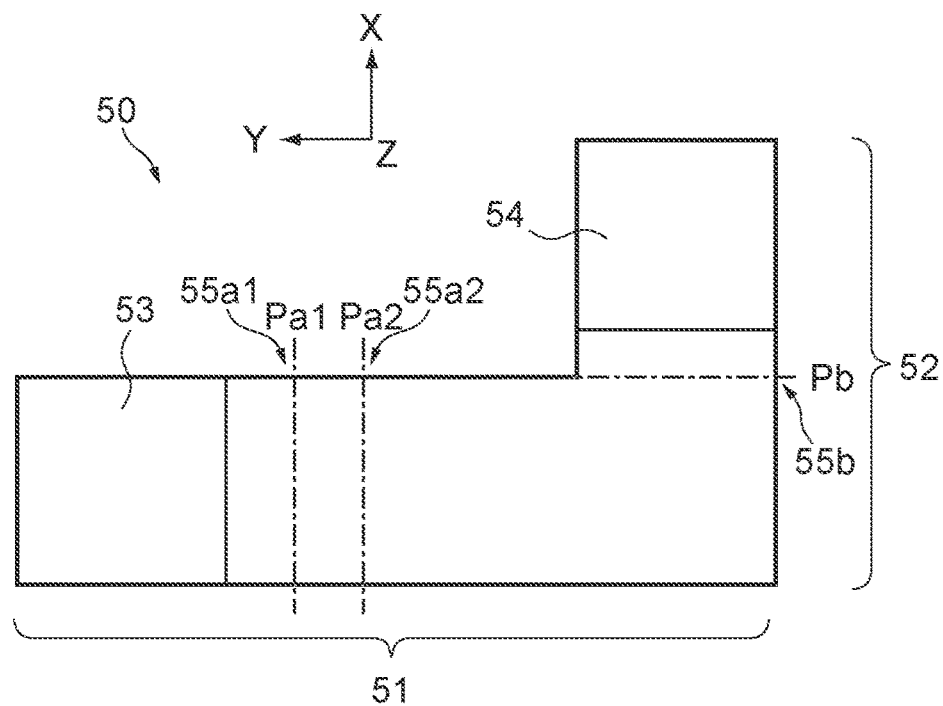
FIG. 21 is a development view of a flexible board according to a modified example of the embodiment.
Figure 22:
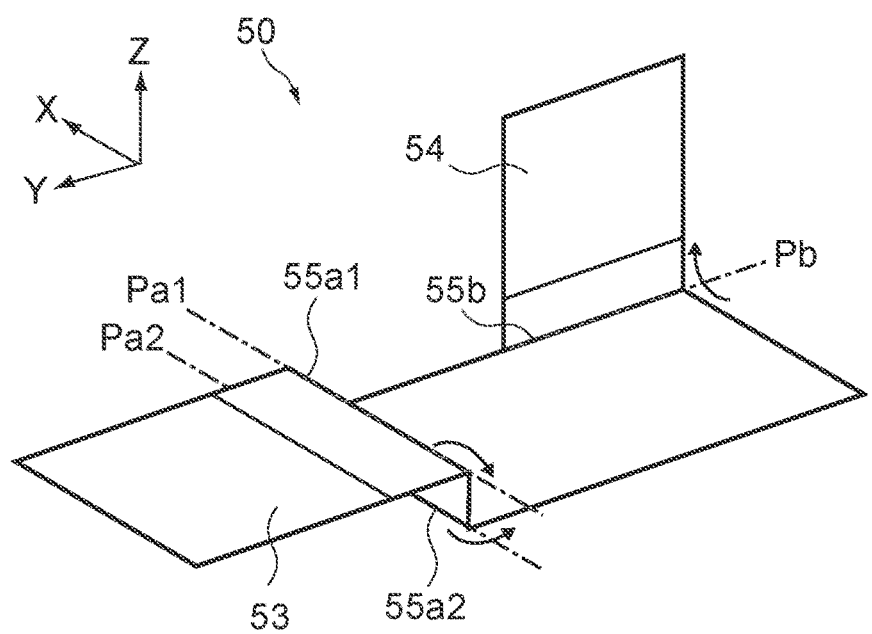
FIG. 22 is a perspective view of a flexible board according to the modified example.

FIGS. 21 and 22 show a flexible board 50 according to a modified example. FIG. 21 is a plan view of the flexible board 50 in a developed state. FIG. 21 is a perspective view of the flexible board 50 in a bent state. Hereinafter, a configuration different from that shown in FIGS. 16 and 17 in the flexible board 50 shown in FIGS. 21 and 22 will be described.

In the flexible board 50 according to the modified example, a first extension portion 51 includes two first bending portions 55a1 and 55a2 that are bendable along first bending axes Pa1 and Pa2 parallel to each other. Additionally, in the flexible board 50 according to the modified example, in the developed state, the bending axes Pa1 and Pa2 and a second bending axis Pb are orthogonal to each other, and the intersection angles are 90°.

In the flexible board 50 according to the modified example, the first bending portion 55a1 is bent downward in the Z-axis direction, the first bending portion 55a2 is bent outward in the Y-axis direction, and the second bending portion 55b is bent upward in the Z-axis direction from the developed state shown in FIG. 21. As a result, the flexible board 50 is in the bent state shown in FIG. 22.

Also in the configuration shown in FIG. 22, it is favorable that the angle formed between the first connection portion 53 and the second connection portion 54 is determined in accordance with the inclination between the main board 13 and the imaging device board 142. That is, the angle formed between the first connection portion 53 and the second connection portion 54 is favorably the same as the angle formed between the main board 13 and the imaging device board 142.

The angle formed between the main board 13 and the imaging device board 142 is set on the basis of the angle of the windshield M01, which is set for each vehicle type of the automobile M. Thus, when the angle formed between the first connection portion 53 and the second connection portion 54 is the same as the angle formed between the main board 13 and the imaging device board 142, the angle formed between the first connection portion 53 and the second connection portion 54 is also based on the angle of the windshield M01 set for each vehicle type of the automobile M.

In the flexible board 50 according to the modified example, since the first bending axes Pa1 and Pa2 and the second bending axis Pb are orthogonal to each other in the developed state, the stress applied to the flexible board 50 from various directions can be absorbed most stably in the bent state. As a result, higher reliability can be obtained in the vehicle-mounted camera 1.

Additionally, the flexible board 50 can successfully absorb the stress applied to the flexible board 50 even if the flexible board 50 includes a plurality of first bending portions 55a as in the above modified example. Additionally, the flexible board 50 may include a plurality of second bending portions 55b and may further include another bending portion bendable along a bending axis extending in a direction different from the bending axes Pa and Pb.

[Structure for Preventing Contamination of Foreign Matter]

The vehicle-mounted camera 1 has a structure for preventing contamination of foreign matter such as chips into the space within the raised portion 22, which is associated with the fastening of the screw members S to the frame 20. Thus, in the vehicle-mounted camera 1, it is possible to prevent a problem due to contamination of foreign matter into the space within the raised portion 22, such as an operation failure of the electric circuit.

Figure 23:
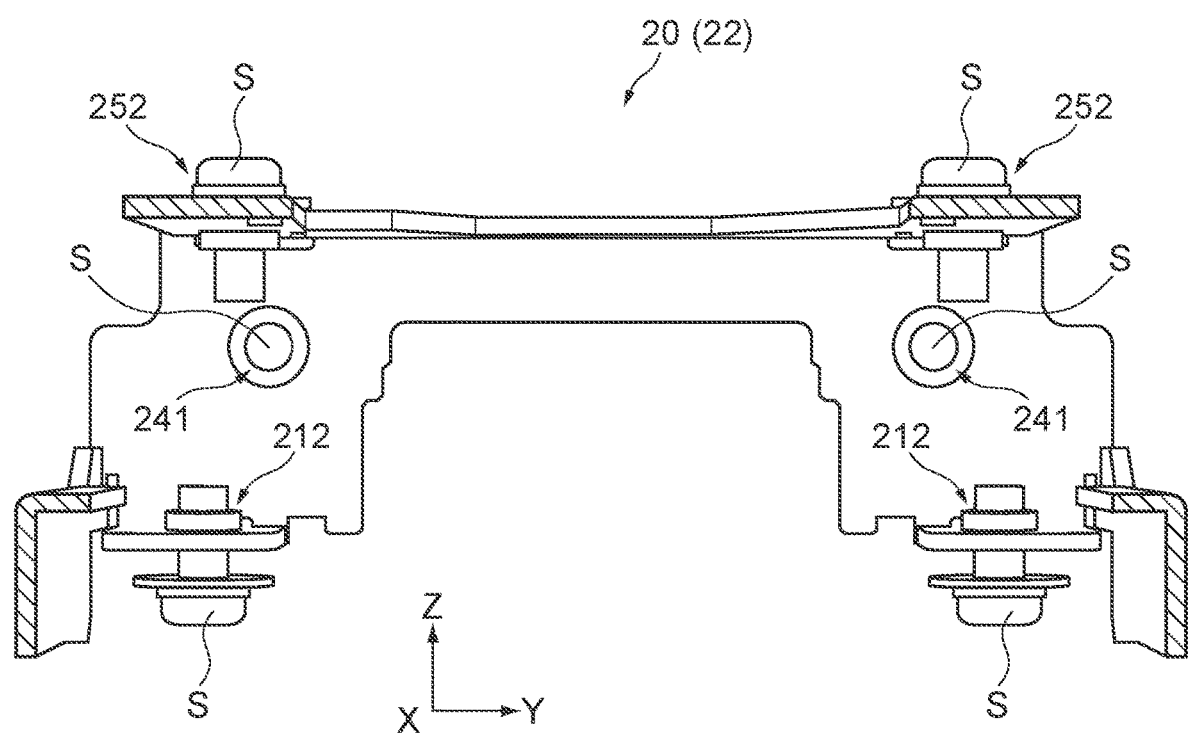
FIG. 23 is a cross-sectional view of the frame taken along the line A-A' of FIG. 5.

FIG. 23 is a cross-sectional view of the frame 20 taken along the A-A' line of FIG. 5. That is, FIG. 23 shows the rear portion of the raised portion 22 in the X-axis direction from the front while the raised portion 22 is broken along the Y-Z plane. For convenience of description, FIG. 23 shows the screw members S for fixing the main board 13, the bottom case 12, and the shield plate 16 to the frame 20.

In the screw hole portions 212 for fixing the main board 13, the screw members S penetrate upward from below in the Z-axis direction. In the screw hole portions 241 for fixing the bottom case 12, the screw members S penetrate from the rear to the front in the X-axis direction. In the screw hole portions 252 for fixing the shield plate 16, the screw members S penetrate downward from above in the Z-axis direction.

That is, the screw members S fastened to the screw hole portions 212, 241, and 252 all have their distal end portions exposed to the space within the raised portion 22 of the frame 20. Thus, when the screw members S are screwed into the screw hole portions 212, 241, and 252, foreign matter such as chips is easily mixed into the space within the raised portion 22.

In this regard, in the vehicle-mounted camera 1 according to this embodiment, it is favorable to provide a first cap member 41, a second cap member 42, and a third cap member 43 that cover the screw hole portion 212, the screw hole portion 241, and the screw hole portion 252 from the inside of the raised portion 22 as a structure for preventing foreign matter from being mixed into the space within the raised portion 22 of the frame 20.

Figure 24:
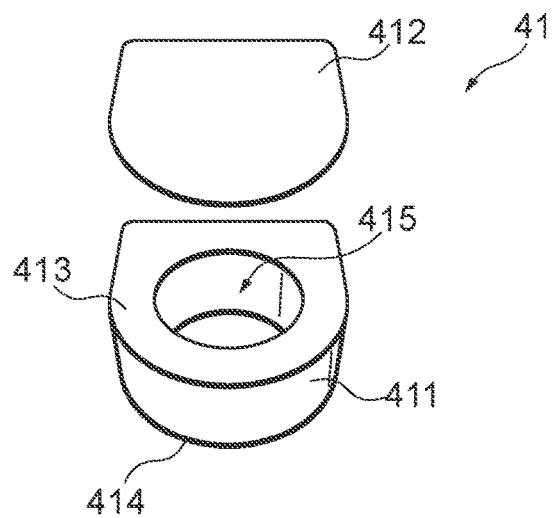
FIG. 24 is an exploded perspective view of a first cap member of the vehicle-mounted camera.

FIG. 24 is an exploded perspective view of the first cap member 41 that covers the screw hole portion 212 of the frame 20. The cap member 41 has a stacked structure including a main body layer 411, a sealing layer 412, an adhesive layer 413, and an adhesive layer 414. The adhesive layers 413 and 414 are provided on both surfaces facing each other in the thickness direction of the main body layer 411.

An opening 415 penetrating in the thickness direction is formed in the main body layer 411 and the adhesive layers 413 and 414. The sealing layer 412 is bonded onto the adhesive layer 413 to seal the opening 415. As a result, the cap member 41 has a cap shape in which the opening 415 is opened only on the adhesive layer 414 side opposite to the adhesive layer 413.

Figure 25:
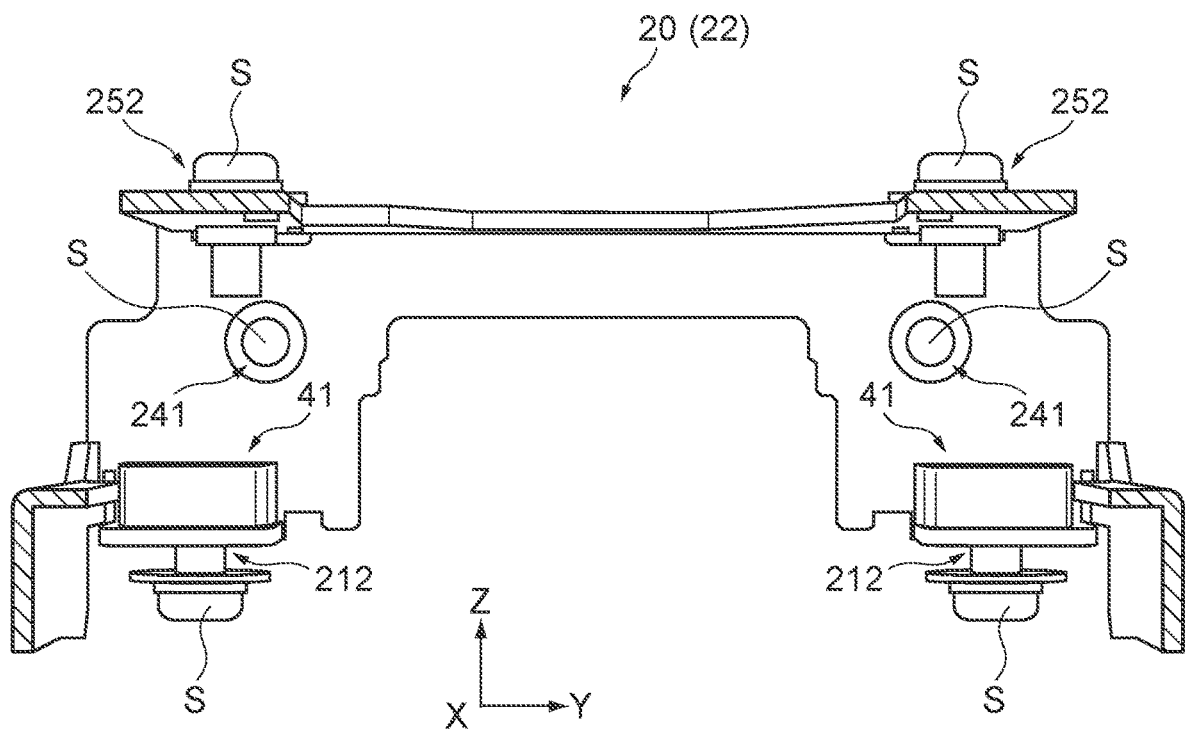
FIG. 25 is a cross-sectional view showing a state of attaching the first cap member to the frame shown in FIG. 23.

FIG. 25 is a cross-sectional view showing a state of attaching the cap member 41 to the frame 20 shown in FIG. 23. The cap member 41 is bonded to the frame 20 by the adhesive layer 414 having the opening 415 opened. The cap member 41 is disposed in each screw hole portion 212 such that each screw hole portion 212 enters the inside of the opening 415.

Thus, in the frame 20, the region where the distal end portion of the screw member S fastened to the screw hole portion 212 from below in the Z-axis direction protrudes is closed by the cap member 41. Thus, the foreign matter generated when the screw member S is screwed into the screw hole portion 212 remains in the opening 415 of the cap member 41 and is not discharged to the outside of the opening 415 of the cap member 41.

Therefore, in the vehicle-mounted camera 1, when the screw member S is screwed into the screw hole portion 212, it is possible to prevent foreign matter from being mixed into the space within the raised portion 22 of the frame 20. Thus, in the vehicle-mounted camera 1, it is possible to prevent a problem due to the contamination of the foreign matter into the space within the raised portion 22, such as an operation failure of the electric circuit.

Additionally, for example, even if a very thin sealing layer 412 of about 0.1 mm is used in the cap member 41, the function of closing the screw hole portion 212 is ensured. Thus, in the vehicle-mounted camera 1, the amount of protrusion of the cap member 41 to the inside of the raised portion 22 of the frame 20 is suppressed to be small, so that the space within the raised portion 22 of the frame 20 can be saved.

Figure 26:
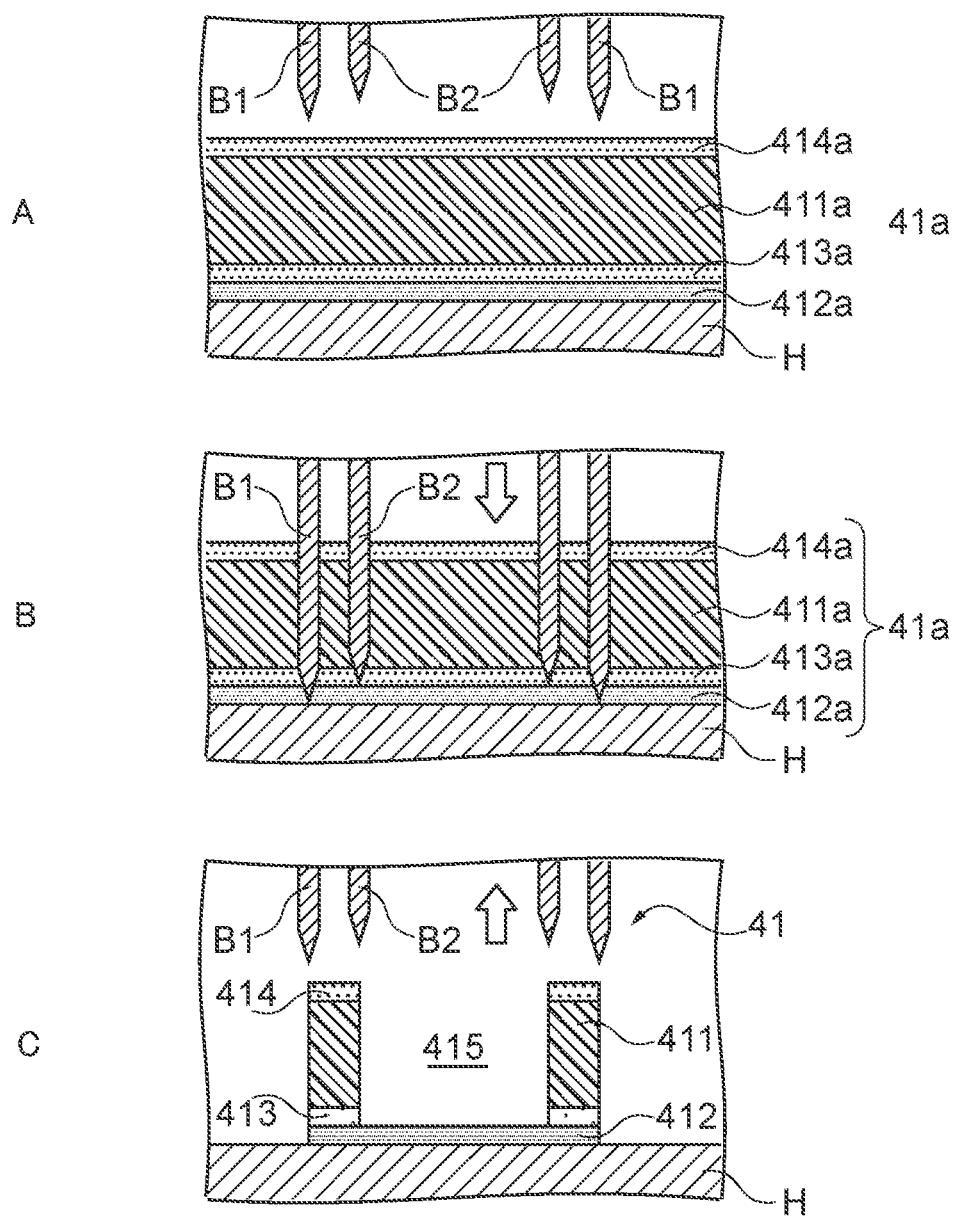
FIG. 26 is a cross-sectional view showing a manufacturing process of the first cap member.

FIG. 26 is a cross-sectional view showing a manufacturing process of the cap member 41. For manufacturing the cap member 41, first, a laminated sheet 41a is prepared. The laminated sheet 41a is a large-sized sheet including a main body sheet 411a corresponding to the main body layer 411, a sealing sheet 412a corresponding to the sealing layer 412, and adhesive sheets 413a and 414a corresponding to the adhesive layers 413 and 414.

First, as shown in FIG. 26(A), the laminated sheet 41a is disposed on a holding plate H with the adhesive sheet 414a facing upward. Then, punching dies B1 and B2 are disposed above the laminated sheet 41a with the cutting edges thereof facing downward. The cutting edge of the punching die B2 is positioned higher than the cutting edge of the punching die B1 by the thickness of the sealing sheet 412a.

The blade of the punching die B1 is formed in a shape corresponding to the outer shape of the cap member 41. The blade of the punching die B2 is formed in a shape corresponding to the opening 415 of the cap member 41. The punching dies B1 and B2 are fixed to each other in the upper parts thereof and are movable in the vertical direction as one unit while maintaining their relative positions.

The laminated sheet 41a is punched by lowering the punching dies B1 and B2 as shown in FIG. 26(B) from the state shown in FIG. 26(A). The punching die B1 reaches the holding plate H and cuts all the sheets 411a, 412a, 413a, and 414a of the laminated sheet 41a. As a result, the outer shape of the cap member 41 is formed.

On the other hand, the punching die B2 remains in front of the holding plate H and does not penetrate the sealing sheet 412a of the lowermost layer. Thus, the punching die B2 cuts the sheets 411a, 413a, and 414a, but does not cut the sealing sheet 412a of the lowermost layer. As a result, the opening 415 of the cap member 41 is formed.

Subsequently, the punching dies B1 and B2 are raised from the state shown in FIG. 26(B). Then, in the laminated sheet 41a, the portion outside the punching die B1 and the portion inside the punching die B2 are removed, and only the portion between the punching dies B1 and B2 is left. As a result, the cap member 41 is obtained as shown in FIG. 26(C).

In this manner, using the laminated sheet 41a, the cap member 41 can be easily manufactured by only one punching operation. Further, the laminated sheet 41a is simultaneously punched using the plurality of punching dies B1 and B2, and thus it is possible to manufacture a large number of cap members 41 at a time. As a result, the cap member 41 can be manufactured at low cost. Note that it is needless to say that the punching operation for the laminated sheet 41a may be performed for each of the punching dies B1 and B2 as necessary.

The material for forming the main body layer 411 (the main body sheet 411a of the laminated sheet 41a) of the cap member 41 is not limited to a specific type, but is favorably a resin material having excellent punchability. Examples of the resin material having excellent punchability include a urethane cushion, a sponge, and an elastomer.

The material for forming the sealing layer 412 (the sealing sheet 412a of the laminated sheet 41a) of the cap member 41 is also not limited to a specific type, and for example, polycarbonate (PC), polyethylene terephthalate (PET), or the like can be used. As the adhesive layers 413 and 414 of the cap member 41, for example, an inexpensive double-sided adhesive tape or the like can be used.

Figure 27:
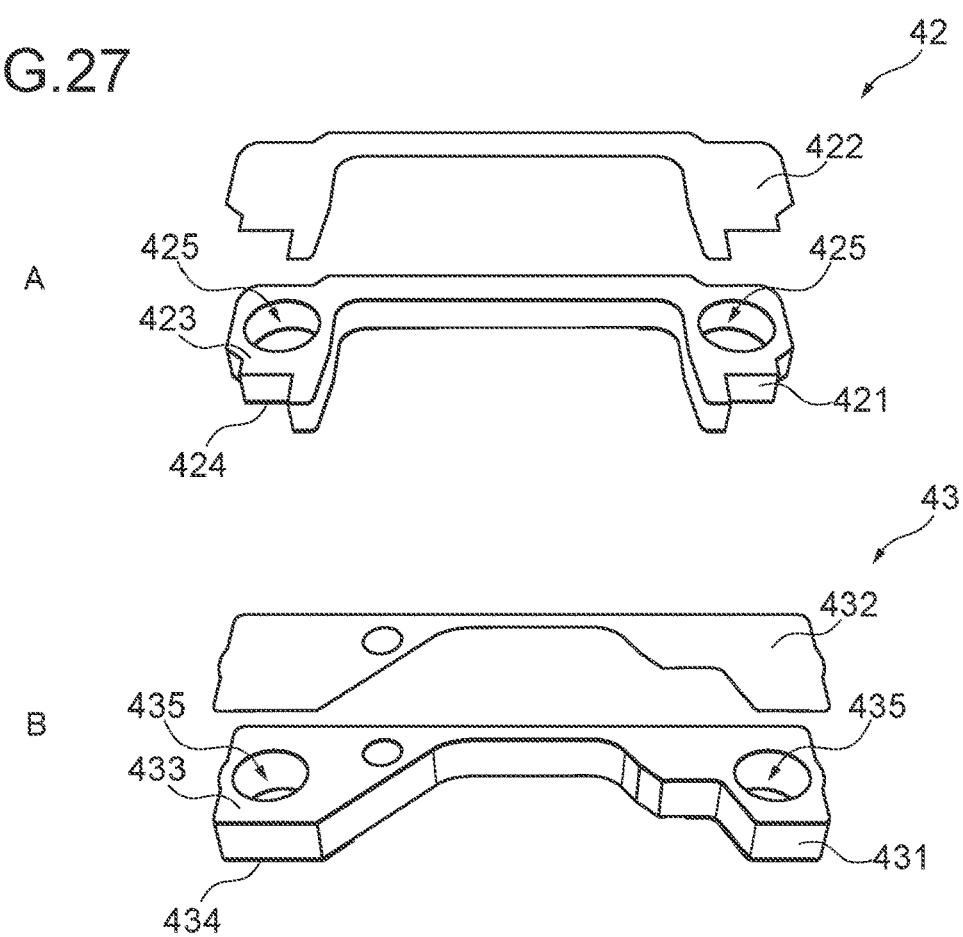
FIG. 27 is an exploded perspective view of second and third cap members of the vehicle-mounted camera.

FIG. 27(A) is an exploded perspective view of the second cap member 42 that covers the screw hole portions 241 of the frame 20. FIG. 27(B) is a perspective view of the third cap member 43 that covers the screw hole portions 252 of the frame 20. The cap members 42 and 43 can be manufactured by the same manufacturing method using the same material as that of the first cap member 41.

The cap member 42 has a stacked structure including a main body layer 421, a sealing layer 422, an adhesive layer 423, and an adhesive layer 424. The cap member 43 has a stacked structure including a main body layer 431, a sealing layer 432, an adhesive layer 433, and an adhesive layer 434. The cap members 42 and 43 are configured to be capable of collectively closing the two screw hole portions 241 and 252, respectively.

More specifically, the cap members 42 and 43 have an elongated shape so as to be capable of simultaneously respectively closing the two screw hole portions 241 and 252 disposed at both end portions of the frame 20 in the Y-axis direction. The cap members 42 and 43 respectively include two openings 425 and 435 corresponding to the two screw hole portions 241 and 252 at both end portions in the longitudinal direction.

Figure 28:
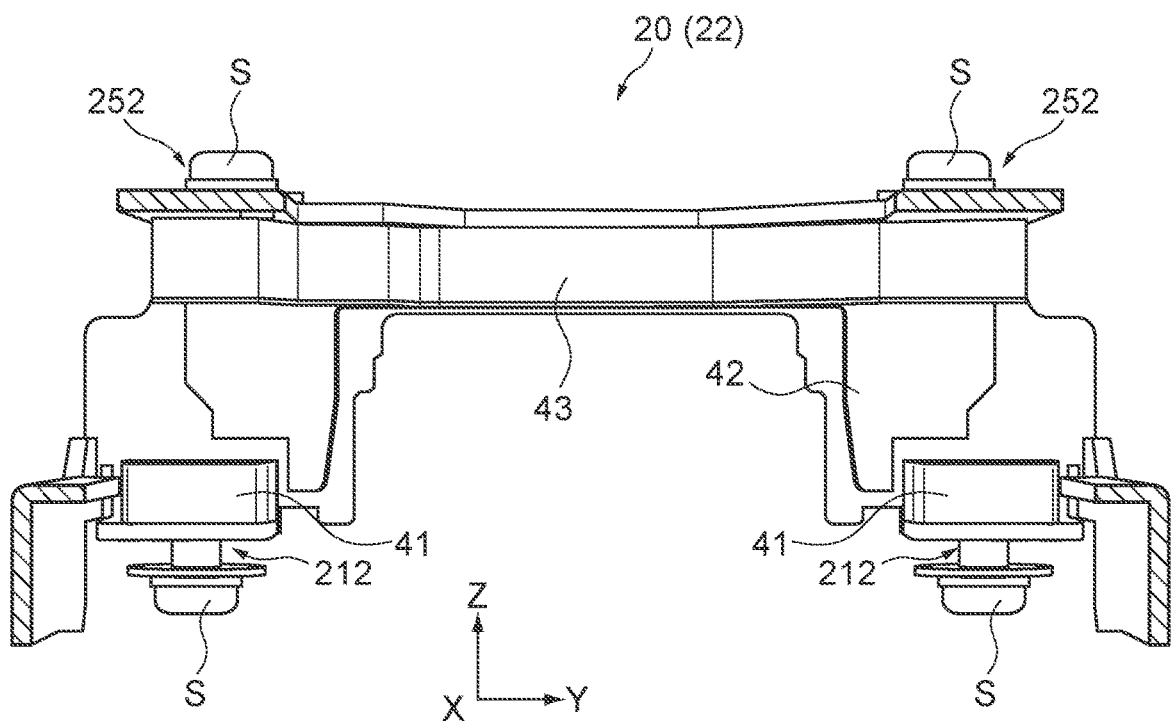
FIG. 28 is a cross-sectional view showing a state of attaching the second and third cap members to the frame shown in FIG. 25.

FIG. 28 is a cross-sectional view showing a state of attaching the cap members 42 and 43 to the frame 20 shown in FIG. 25. As shown in FIG. 28, in the frame 20, the screw hole portions 241 are closed by the cap member 42 from the front in the X-axis direction, and the screw hole portions 252 are closed by the cap member 43 from below in the Z-axis direction.

Therefore, in the vehicle-mounted camera 1, when the screw members S are screwed into the screw hole portions 241 and 252, it is possible to prevent foreign matter from being mixed into the space within the raised portion 22 of the frame 20. Thus, in the vehicle-mounted camera 1, it is possible to prevent a problem due to contamination of foreign matter into the space within the raised portion 22, such as an operation failure of the electric circuit.

In the vehicle-mounted camera 1, since the single cap members 42 and 43 are capable of collectively closing the two screw hole portions 241 and 252, respectively, it is possible to reduce the cost due to a decrease in the number of components. Note that the cap member according to this embodiment can be configured to include three or more openings when three or more screw hole portions to be closed are present on the same plane.

Similarly to the first cap member 41, the cap members 42 and 43 are capable of suppressing the amount of protrusion to the inside of the raised portion 22 of the frame 20. Thus, as shown in FIG. 28, the cap members 42 and 43 are capable of closing, without force, the screw hole portions 241 and 252 provided at positions close to each other on planes orthogonal to each other.

[Another Configuration Example of Vehicle-Mounted Camera 1]

The configuration of the vehicle-mounted camera 1 is not limited to the above and can be variously modified. For example, the vehicle-mounted camera 1 may include a plurality of imaging units 14. In this case, the plurality of imaging device boards 142 is connected to the common main board 13 by the plurality of flexible boards 50 provided for the respective imaging units 14.

Additionally, the vehicle-mounted camera 1 can be attached not only to the windshield M01, but also to the rear window M02 as a rear-sensing camera. Moreover, the vehicle-mounted camera 1 may be used for, for example, viewing, not for sensing. In this case as well, the vehicle-mounted camera 1 has the merit of being capable of compatibility between miniaturization and high functionality.

Further, the method of attaching the vehicle-mounted camera 1 to the inner surface of the windshield M01 is not limited to the configuration using the bracket 2 as shown in FIG. 3. For example, the vehicle-mounted camera 1 may be fixed to the windshield M01 via a member other than the bracket 2 or may be directly bonded to the inner surface of the windshield M01.

Note that the vehicle-mounted camera 1 is applicable not only to the automobile M, but also to various movable bodies. Examples of a movable body to which the vehicle-mounted camera 1 is applicable include an automobile, an electric vehicle, a hybrid electric vehicle, a motorcycle, a bicycle, personal mobility, an airplane, a drone, a ship, a robot, construction machinery, and agricultural machinery (a tractor).

[Drive Control System S100]

(Brief Description)

A drive control system 5100 according to an embodiment of the present technology is a system used to control driving of the automobile M using the vehicle-mounted camera 1 described above. Specifically, the drive control system 5100 controls the driving force generating mechanism M11, the braking mechanism M12, the steering mechanism M13, and the like of the automobile M using an image captured using the vehicle-mounted camera 1. The image captured by the vehicle-mounted camera 1 is transmitted to the drive control systems 5100 in the form of high-quality image data (raw image data) that has not been compressed and encoded.

The drive control system 5100 may have a configuration corresponding to a function necessary for the automobile M. Specifically, examples of a function that can be implemented by the drive control system 5100 include a driving assistance function and an autonomous driving function. A configuration of the drive control system 5100 making it possible to implement the driving assistance function and the autonomous driving function is described below.

(Driving Assistance Function)

The driving assistance function is typically a function of advanced driver-assistance systems (ADAS) including collision avoidance, shock mitigation, following driving (maintaining a following distance), vehicle speed maintaining driving, a warning of collision, a warning of deviation from a lane, and the like. The drive control system S100 may be configured such that these driving assistance functions can be implemented.

Figure 29:
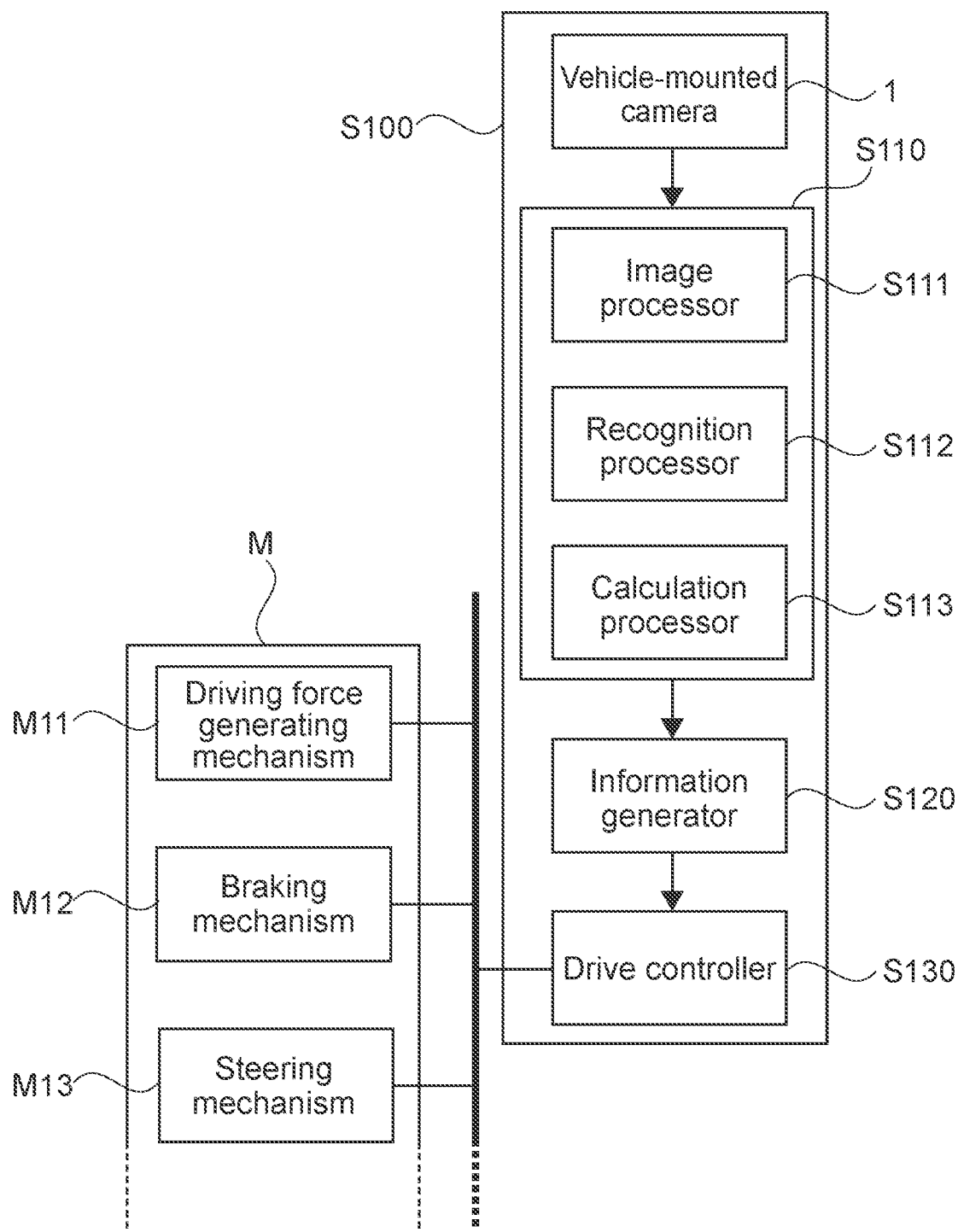
FIG. 29 is a block diagram showing a configuration that makes it possible to implement a driving assistance function in a drive control system according to an embodiment of the present technology.

FIG. 29 is a block diagram showing the configuration of the drive control system S100 making it possible to implement the driving assistance function. The drive control system S100 includes the vehicle-mounted camera 1, a processor S110, an information generator S120, and a drive controller S130. The processor S110 includes an image processor S111, a recognition processor S112, and a calculation processor S113.

The respective structural elements of the drive control system S100 are connected to each other through a communication network. The communication network may be, for example, a vehicle-mounted communication network that conforms to any standard such as a controller area network (CAN), a local interconnect network (LIN), a local area network (LAN), or FlexRay (registered trademark).

Figure 30:
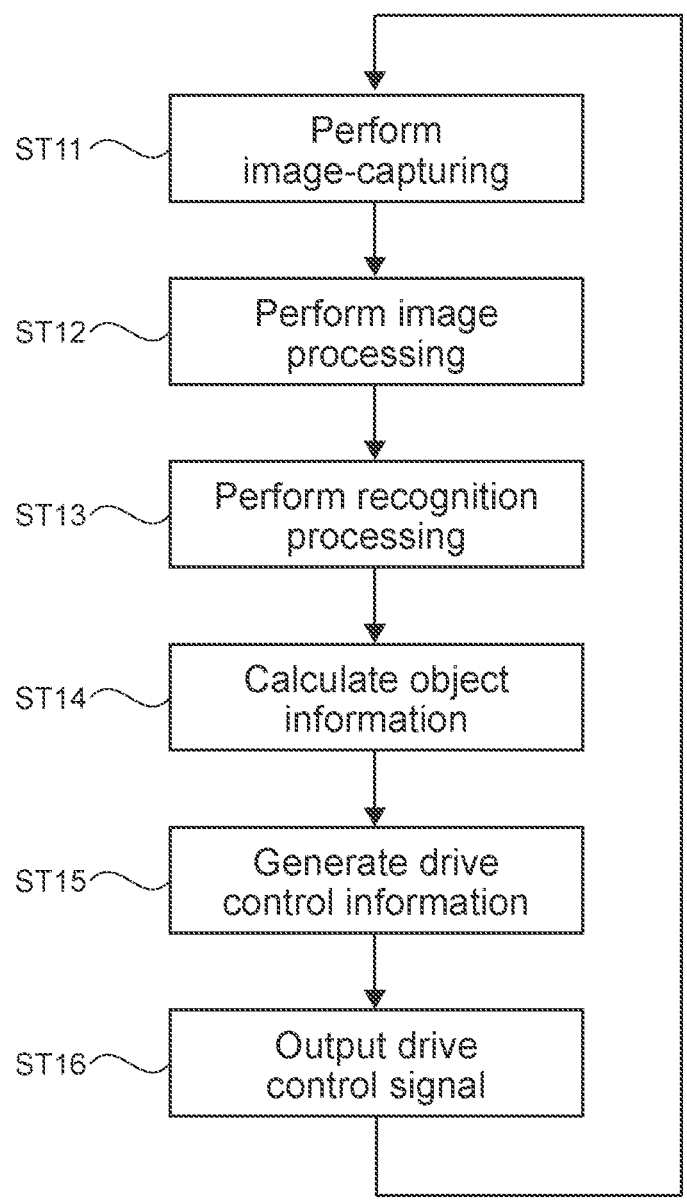
FIG. 30 is a flowchart showing a drive control method performed by the drive control system.

FIG. 30 is a flowchart showing a drive control method performed by the drive control system S100 shown in FIG. 29. The drive control method shown in FIG. 30 includes Step ST11 of image-capturing, Step ST12 of image processing, Step ST13 of recognition processing, Step ST14 of object-information calculation, Step ST15 of drive-control-information generation, and Step ST16 of drive-control-signal output.

In Step ST11 of image-capturing, the vehicle-mounted camera 1 captures an image of the scenery ahead of the automobile M through the windshield M01 to generate a raw image of the scenery. For example, the vehicle-mounted camera 1 transmits the raw image to the processor S110 using an in-vehicle communication section mounted on the main board 13.

The processor S110 typically includes an electronic control unit (ECU), and processes a raw image generated by the vehicle-mounted camera 1. More specifically, in the processor S110, the image processor S111 performs Step ST12 of image processing, the recognition processor S112 performs Step ST13 of recognition processing, and the calculation processor S113 performs Step ST14 of object-information calculation.

In Step ST12 of image processing, the image processor S111 performs image processing on the raw image to generate a processed image. The image processing performed by image processor S111 is typically processing performed to make it easy to recognize an object in a raw image, and examples of the image processing performed by image processor S111 include an automatic exposure control, an automatic white-balance adjustment, and high dynamic range combining.

Note that, in Step ST12 of image processing, at least a portion of the image processing may be performed by an image processor mounted on the main board 13 of the vehicle-mounted camera 1. Note that, when the image processor of the vehicle-mounted camera 1 performs all of the image processing of Step ST12 of image processing, the processor S110 does not have to include the image processor S111.

In Step ST13 of recognition processing, the recognition processor S112 performs recognition processing on the processed image to recognize an object in the processed image. Note that the object recognized by the recognition processor S112 is not limited to a three-dimensional object, and examples of the recognized object include a vehicle, a pedestrian, an obstacle, a traffic light, a traffic sign, a lane of a road, and a curb.

In Step ST14 of object-information calculation, the calculation processor S113 calculates object information related to an object in the processed image. Examples of the object information calculated by the calculation processor S113 include the shape of an object, the distance to an object, and the movement direction and the movement speed of an object. The calculation processor S113 uses a plurality of temporally consecutive processed images to calculate dynamic object information.

Figure 31:
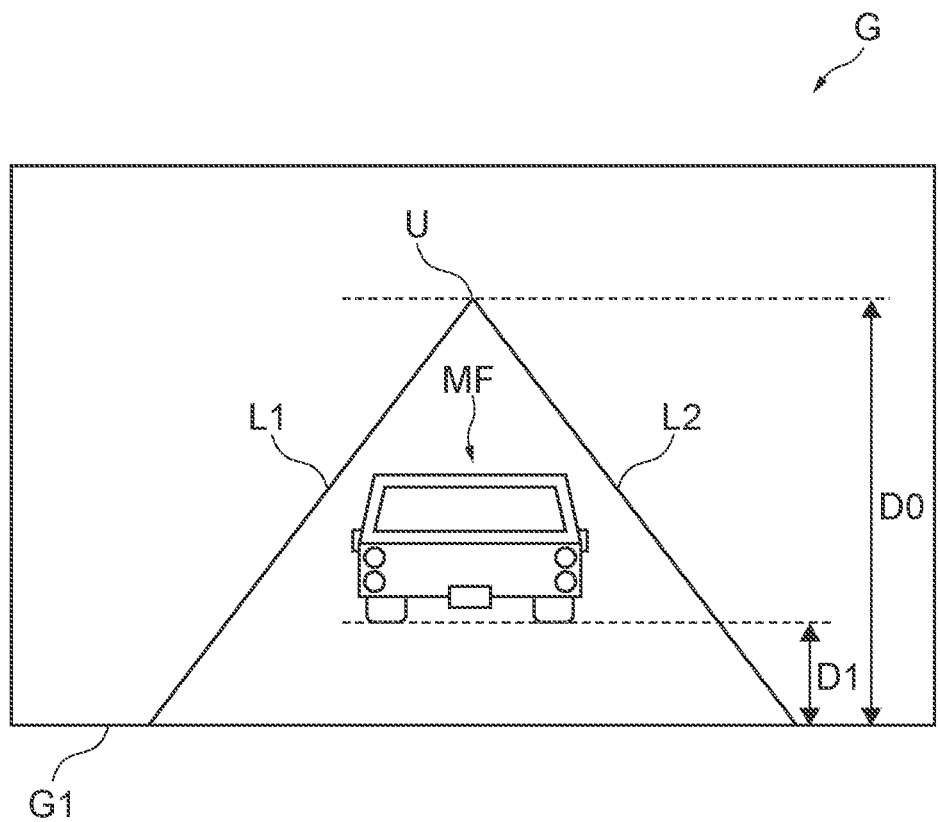
FIG. 31 is a diagram for describing an example of a method of calculating a following distance to a preceding vehicle that is performed by a calculation processor of the drive control system.

A method of calculating a following distance to a preceding automobile MF is described as an example of the method of calculating object information that is performed by the calculation processor S113. FIG. 31 shows an example of a processed image G generated by the image processor S111. The preceding automobile MF, and two lanes L1 and L2 that define travel lanes appear in the processed image G shown in FIG. 31.

First, a vanishing point U at which the two lanes L1 and L2 intersect is obtained in the processed image G. Note that the vanishing point U may be obtained from other objects without using the lanes L1 and L2. For example, the calculation processor S113 may also obtain the vanishing point U using, for example, a curb, or a movement trajectory of a fixed object such as a traffic sign in a plurality of processed images.

Next, a distance D0 from a lower edge G1 of the processed image to the preceding automobile MF (a dimension in an up-down direction of the image), and a distance D1 from the lower edge G1 of the processed image to the preceding automobile MF (a dimension in the up-down direction of the image) are obtained. The following distance to the preceding automobile MF can be obtained using the distances D0 and D1. For example, the use of a ratio between the distance D0 and the distance D1 makes it possible to calculate the following distance to the preceding automobile MF.

As described above, when the distance is calculated on the basis of the pixel position of the object such as the preceding automobile MF in the image, the detection position of the object may be shifted in the image that is not in focus, so that the accuracy may be deteriorated. In this respect, in the vehicle-mounted camera 1 according to the present technology, the distance from the object can be accurately calculated by the configuration in which the allowable range of the focal position shift of the optical unit 141 is small.

The processor S110 transmits, to the information generator S120, data including the processed image and the object information that are obtained in Steps ST12 to ST14. Note that the processor S110 is not limited to the configuration described above, and, for example, the processor S110 may include a structural element other than image processor S111, the recognition processor S112, and the calculation processor S113.

In Step ST15 of drive-control-information generation, the information generator S120 generates drive control information including details of driving necessary for the automobile M. More specifically, on the basis of the data transmitted by the processor S110, the information generator S120 determines details of driving to be performed by the automobile M, and generates drive control information including the details of driving.

Examples of the details of driving of the automobile M include a change in speed (acceleration and deceleration) and a change in traveling direction. The following are specific examples: when the following distance of the automobile M to the preceding automobile MF is small, the information generator S120 determines that the automobile M is to be decelerated, and when the automobile M is likely to deviate from its lane, the information generator S120 determines that the traveling direction is to be changed such that the automobile M moves toward a lane center.

The information generator S120 transmits the drive control information to the drive controller S130. Note that the information generator S120 may generate information other than the drive control information. For example, the information generator S120 may detect the brightness in the ambient environment from a processed image, and may generate information regarding an illumination control performed to turn on a headlight of the automobile M when it is dark in the ambient environment.

In Step ST16 of drive-control-signal output, the drive controller S130 outputs a drive control signal on the basis of the drive control information. For example, the drive controller S130 can accelerate the automobile M using the driving force generating mechanism M11, decelerate the automobile M using the braking mechanism M12, and change a traveling direction of the automobile M using the steering mechanism M13.

(Autonomous Driving Function)

The autonomous driving function is a function of autonomously driving the automobile M without an operation being performed by a driver. In order to implement an autonomous driving function, there is a need for a more sophisticated drive control, compared to the case of the driving assistance function. The use of the vehicle-mounted camera 1 being capable of generating a high-quality raw image enables the drive control system S100 to more accurately perform a sophisticated drive control that makes it possible to implement an autonomous driving function.

Figure 32:
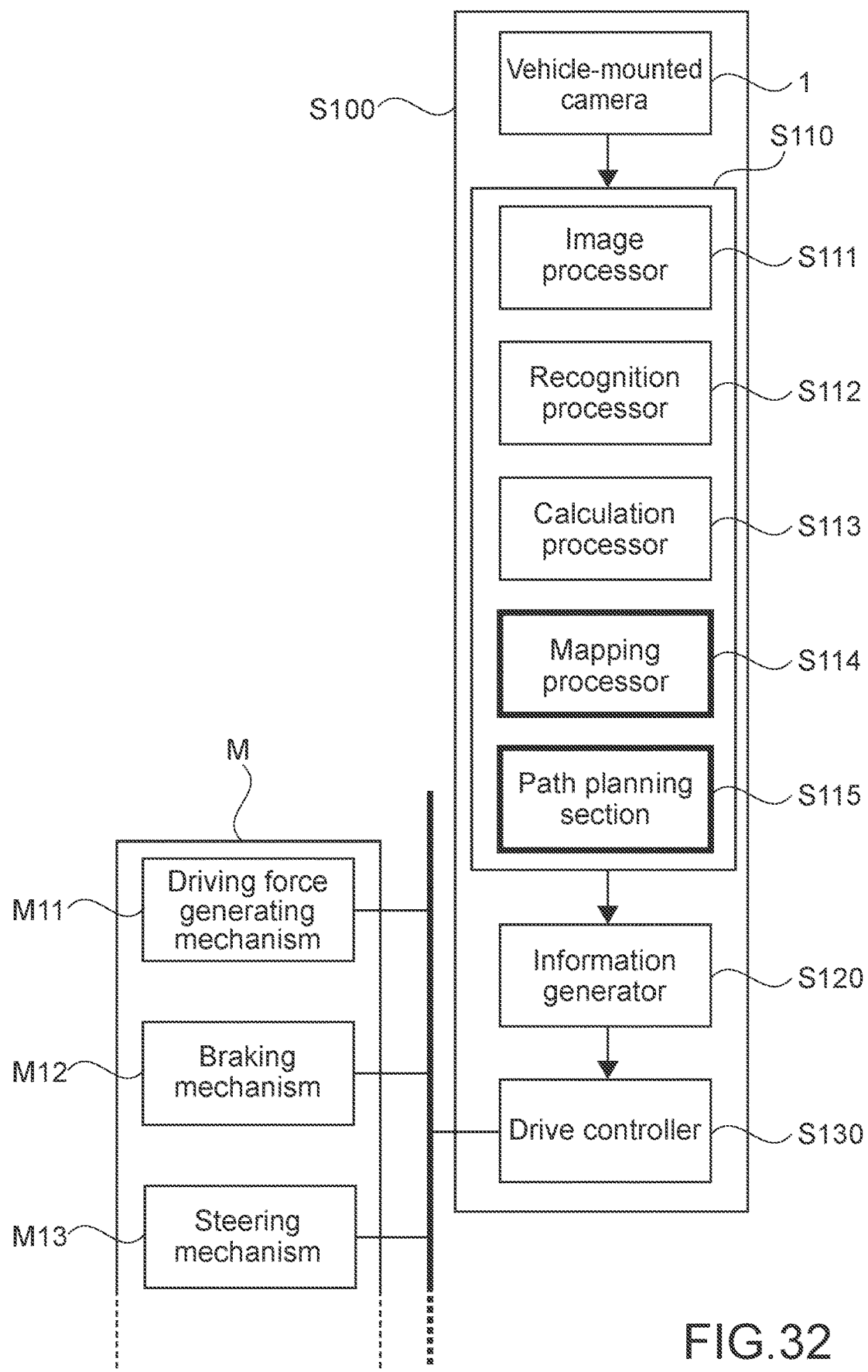
FIG. 32 is a block diagram showing a configuration that makes it possible to implement an autonomous driving function in the drive control system.

FIG. 32 is a block diagram showing a configuration of the drive control system S100 making it possible to implement an autonomous driving function. In addition to the respective structural elements shown in FIG. 29, this drive control system S100 further includes a mapping processor S114 and a path planning section S115 that are included in the processor S110. Descriptions of structural elements similar to those shown in FIG. 29 are omitted below as appropriate.

Figure 33:
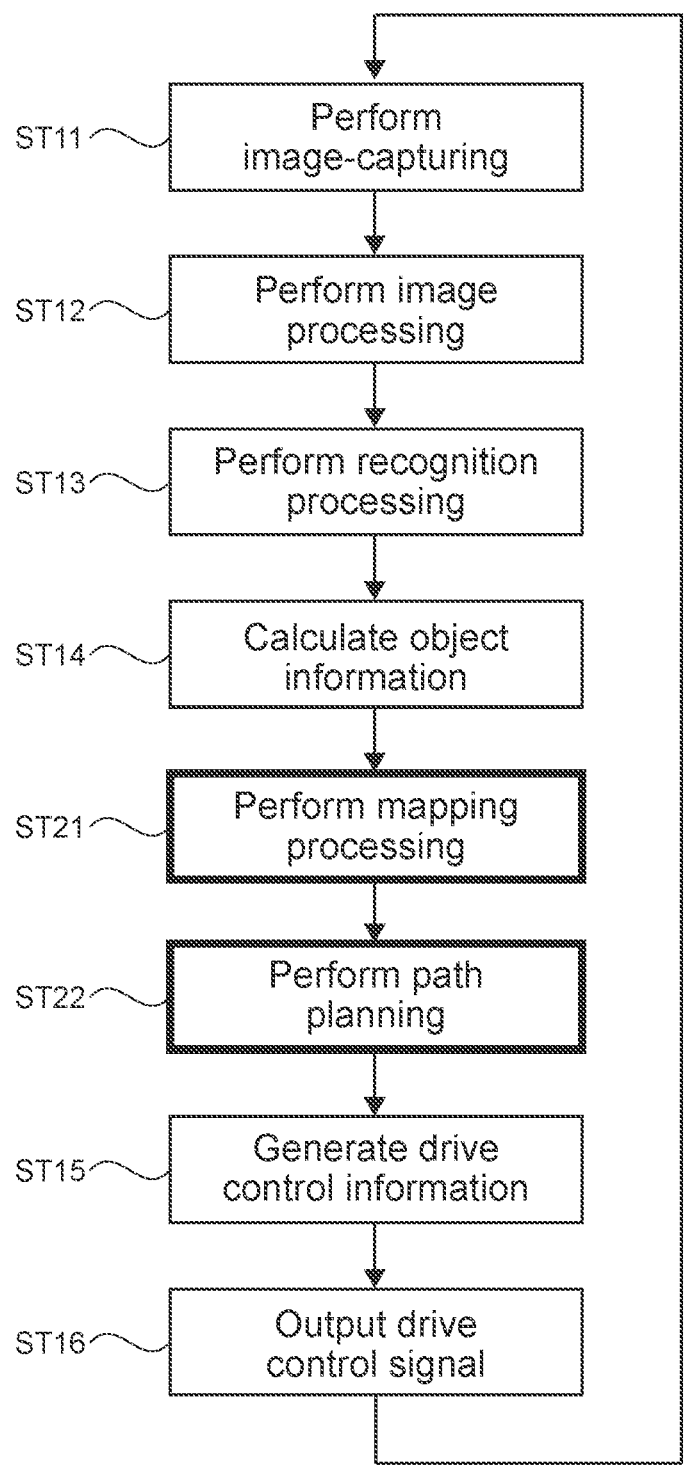
FIG. 33 is a flowchart showing a drive control method performed by the drive control system.

FIG. 33 is a flowchart showing a drive control method performed by the drive control system S100 shown in FIG. 32. In addition to the respective steps shown in FIG. 30, the drive control method shown in FIG. 33 includes Step ST21 of mapping processing, which is performed by the mapping processor S114, and Step ST22 of path planning, which is performed by the path planning section S115.

As shown in FIG. 33, Step ST21 of mapping processing and Step ST22 of path planning are performed between Step ST14 of object-information calculation and Step ST15 of drive-control-information generation. Step ST22 of path planning is performed after Step ST21 of mapping processing.

In Step ST21 of mapping processing, the mapping processor S114 performs spatial mapping using a processed image and object information to create a digital map. The digital map created by the mapping processor S114 is a three-dimensional map created by combining static information and dynamic information that are necessary to perform autonomous driving.

In the drive control system S100, it is possible to create a high-resolution digital map using the mapping processor S114 since a high-quality raw image is obtained using the vehicle-mounted camera 1. Note that the mapping processor S114 can create a digital map including more information by acquiring information other than a raw image obtained using the vehicle-mounted camera 1.

For example, the mapping processor S114 can acquire information from, for example, a surrounding information detector and a positioning section that are included in the automobile M. Further, the mapping processor S114 can acquire various information by communicating with various apparatuses situated in the external environment through a vehicle-exterior communication section that makes it possible to perform a vehicle-exterior communication.

The surrounding information detector is configured as, for example, an ultrasonic sensor, a radar device, a LIDAR (light detection and ranging, laser imaging detection and ranging) device, or the like. The mapping processor S114 can also acquire, from the surrounding information detector, information regarding, for example, regions in the rear and on the lateral side of the automobile M that is not easily obtained from the vehicle-mounted camera 1.

The positioning section is capable of receiving, for example, a global navigation satellite system (GNSS) signal from a GNSS satellite (such as a Global Positioning System (GPS) signal from a GPS satellite) and performing positioning. The mapping processor S114 can acquire information regarding the position of the automobile M from the positioning section.

The vehicle-exterior communication section may use, for example, Global System for Mobile Communications (GSM) (registered trademark), WiMAX (registered trademark), Long-Term Evolution (LTE) (registered trademark), LTE-advanced (LTE-A), a wireless LAN (also referred to as Wi-Fi (registered trademark)), Bluetooth (registered trademark), or the like.

In Step ST22 of path planning, the path planning section S115 performs path planning performed to determine a traveling route of the automobile M, using a digital map. Examples of the path planning include various processes such as detection of an empty space on a road, and prediction of the movement of an object such as a vehicle and a human.

After Step ST22 of path planning, the processor S110 collectively transmits, to the information generator S120, data including the digital map and a result of the path planning that are obtained in Steps ST21 and ST22, in addition to the data including the processed image and the object information that are obtained in Steps ST12 to ST14.

In Step ST15 of drive-control-information generation, the information generator S120 generates drive control information including details of driving performed to cause the automobile M to travel along a traveling route in accordance with the path planning determined in Step ST22 of path planning. The information generator S120 transmits the generated drive control information to the drive controller S130.

In Step ST16 of drive-control-signal output, the drive controller S130 outputs a drive control signal on the basis of the drive control information. In other words, the drive controller S130 controls driving of the driving force generating mechanism M11, the braking mechanism M12, the steering mechanism M13, and the like such that the automobile M can safely travel along a traveling route in accordance with the path planning.

In this manner, when processes such as object position detection, distance measurement, digital map creation, and path planning are performed, the detection position of the object is shifted in an image that is not in focus, so that the accuracy may be deteriorated. In this regard, in the vehicle-mounted camera 1 according to the present technology, such processes can be accurately performed by the configuration in which the allowable range of the focal position shift of the optical unit 141 is small.

Note that, in FIGS. 29 and 32, the vehicle-mounted camera 1 and other configurations (blocks) have been described as different configurations of the drive control system S100. However, any block in the drive control system S100 may be included in the vehicle-mounted camera 1. In this case, a circuit having the function of each block is disposed on the main board 13 (or another circuit board electrically connected to the main board 13) in the vehicle-mounted camera 1.

For example, the image processor S111 may be included in the vehicle-mounted camera 1. In this case, a circuit having the function of the image processor S111 is disposed on the main board 13 (or another circuit board electrically connected to the main board 13) in the vehicle-mounted camera 1.

Additionally, the processor S110 including a plurality of blocks may be included in the vehicle-mounted camera 1. In this case, a circuit having the function of each block included in the processor S110 is disposed on the main board 13 (or another circuit board electrically connected to the main board 13) in the vehicle-mounted camera 1.

Further, the drive control system S100 may be a single device. In this case, a circuit having the function of each block included in the drive control system S100 is disposed on the main board 13 (or another circuit board electrically connected to the main board 13) in the vehicle-mounted camera 1.

[Other Embodiments]

The embodiment of the present technology has been described above. However, of course the present technology is not limited to the embodiment described above, and various modifications may be made thereto without departing from the scope of the present technology.

Note that the present technology may also take the following configurations.

(1) A vehicle-mounted camera, including:
an imaging device board including a first terminal;
a main board including a second terminal; and
a flexible board including
a first connection portion to be connected to the first terminal,
a second connection portion to be connected to the second terminal, and
a first bending portion and a second bending portion that are located between the first connection portion and the second connection portion and are bent along a first bending axis and a second bending axis intersecting with each other in a developed state of the flexible board.

(2) The vehicle-mounted camera according to (1), in which the flexible board further includes
a first extension portion including the first bending portion, and
a second extension portion including the second bending portion, and
in the developed state of the flexible board, the first extension portion extends in a direction orthogonal to the first bending axis, and the second extension portion extends in a direction orthogonal to the second bending axis.

(3) The vehicle-mounted camera according to (1) or (2), in which
the first bending axis and the second bending axis are orthogonal to each other in the developed state of the flexible board.

(4) The vehicle-mounted camera according to any one of (1) to (3), further including
an optical unit having an optical axis extending in a thickness direction of the imaging device board.

(5) The vehicle-mounted camera according to any one of (1) to (4), in which
the imaging device board further includes a crystal oscillator, and
the flexible board does not pass above the crystal oscillator.

REFERENCE SIGNS LIST 1 vehicle-mounted camera
2 bracket
11 front case
12 bottom case
13 main board
132 terminal
14 imaging unit
141 optical unit
142 imaging device board
142a terminal
142b crystal oscillator
15 pressing member
16 shield plate
20 frame
30 holder
50 flexible board
51, 52 extension portion
53, 54 connection portion
55a, 55b bending portion
Pa, Pb bending axis
M automobile
M1 windshield

The invention claimed is:

1. A vehicle-mounted camera, comprising:
an imaging device board including a first terminal;
a main board including a second terminal; and
a flexible board including
a first connection portion to be connected to the first terminal,
a second connection portion to be connected to the second terminal, and
a first bending portion located adjacent to the first connection portion and between the first connection portion and the second connection portion and a second bending portion located adjacent to the second connection portion and between the first connection portion and the second connection portion, wherein the first bending portion is bent along a first bending axis and the second bending portion is bent along a second bending axis, and the first bending axis and the second bending axis intersect each other at an angle.

2. The vehicle-mounted camera according to claim 1, wherein
the flexible board further includes
a first extension portion including the first bending portion, and
a second extension portion including the second bending portion, and
the first extension portion extends in a direction orthogonal to the first bending axis, and the second extension portion extends in a direction orthogonal to the second bending axis.

3. The vehicle-mounted camera according to claim 1, wherein
the first bending axis and the second bending axis are orthogonal to each other.

4. The vehicle-mounted camera according to claim 1, further comprising
an optical unit having an optical axis extending in a thickness direction of the imaging device board.

5. The vehicle-mounted camera according to claim 1, wherein
the imaging device board further includes a crystal oscillator, and
the flexible board is not located above the crystal oscillator.

* * * * *